(12) United States Patent
Toyoda

(10) Patent No.: US 10,878,748 B2
(45) Date of Patent: Dec. 29, 2020

(54) DISPLAY DEVICE

(71) Applicant: Japan Display Inc., Tokyo (JP)

(72) Inventor: Hironori Toyoda, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/386,336

(22) Filed: Apr. 17, 2019

(65) Prior Publication Data
US 2019/0325819 A1     Oct. 24, 2019

(30) Foreign Application Priority Data
Apr. 24, 2018   (JP) .................. 2018-082827

(51) Int. Cl.
| G09G 3/3225 | (2016.01) |
| H01L 27/32 | (2006.01) |
| H01L 51/50 | (2006.01) |
| H01L 51/52 | (2006.01) |

(52) U.S. Cl.
CPC ....... *G09G 3/3225* (2013.01); *H01L 27/3209* (2013.01); *H01L 27/3244* (2013.01); *H01L 51/504* (2013.01); *H01L 51/5203* (2013.01)

(58) Field of Classification Search
CPC .............. G09G 3/3225; H01L 27/3209; H01L 27/3244; H01L 51/504; H01L 27/3246
See application file for complete search history.

(56) References Cited

U.S. PATENT DOCUMENTS

| 2013/0001612 A1* | 1/2013 | Lee | ............... H01L 51/5265 |
| | | | 257/98 |
| 2015/0187857 A1* | 7/2015 | Negishi | ............... H01L 51/5284 |
| | | | 257/40 |
| 2015/0349030 A1* | 12/2015 | Ono | ............... G02B 5/201 |
| | | | 257/40 |
| 2016/0118449 A1 | 4/2016 | Sato et al. | |
| 2016/0155785 A1 | 6/2016 | Sato | |
| 2016/0365389 A1* | 12/2016 | Gao | ............... H01L 51/5016 |

FOREIGN PATENT DOCUMENTS

| JP | 2016-085913 A | 5/2016 |
| JP | 2016-103395 A | 6/2016 |

* cited by examiner

*Primary Examiner* — Temesghen Ghebretinsae
*Assistant Examiner* — Karin Kiyabu
(74) *Attorney, Agent, or Firm* — Michael Best & Friedrich LLP

(57) ABSTRACT

Provided is a display device possessing a first pixel, a second pixel, a partition wall, and an emission-quenching layer. The first pixel includes a first pixel electrode, a first emission layer located over the first pixel electrode and containing a first emission material, and an opposing electrode over the first emission layer. The second pixel is adjacent to the first pixel and includes a second pixel electrode, a second emission layer located over the second pixel electrode and containing a second emission material, and the opposing electrode. The emission-quenching layer is sandwiched by the partition wall and the opposing electrode and contains at least one of the first emission material and the second emission material at a concentration higher than at least one of a concentration of the first emission material in the first emission layer and a concentration of the second emission material in the second emission layer.

19 Claims, 20 Drawing Sheets

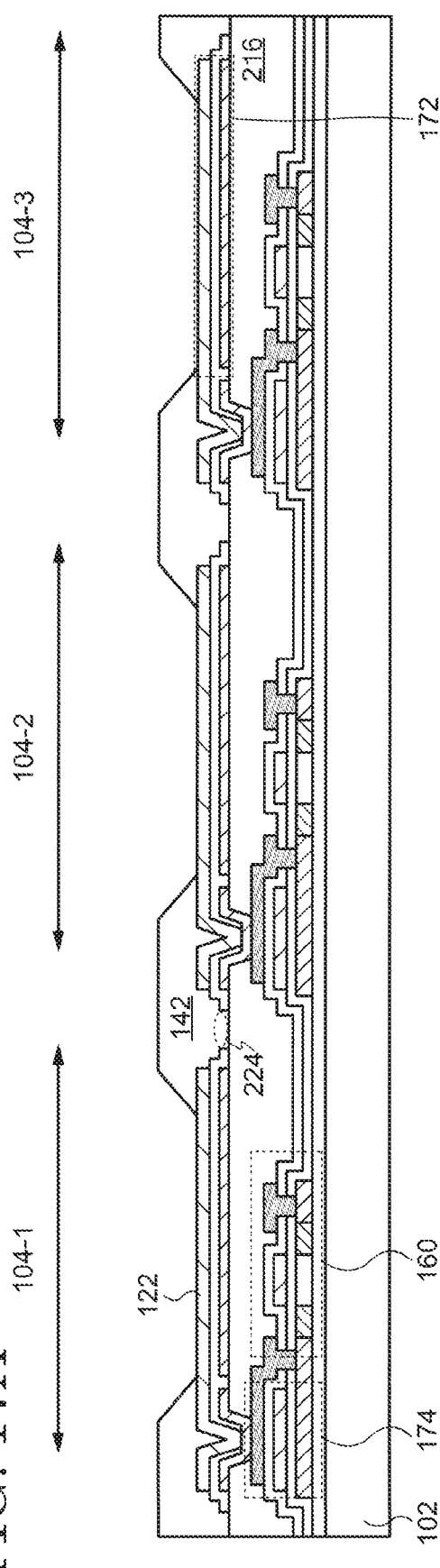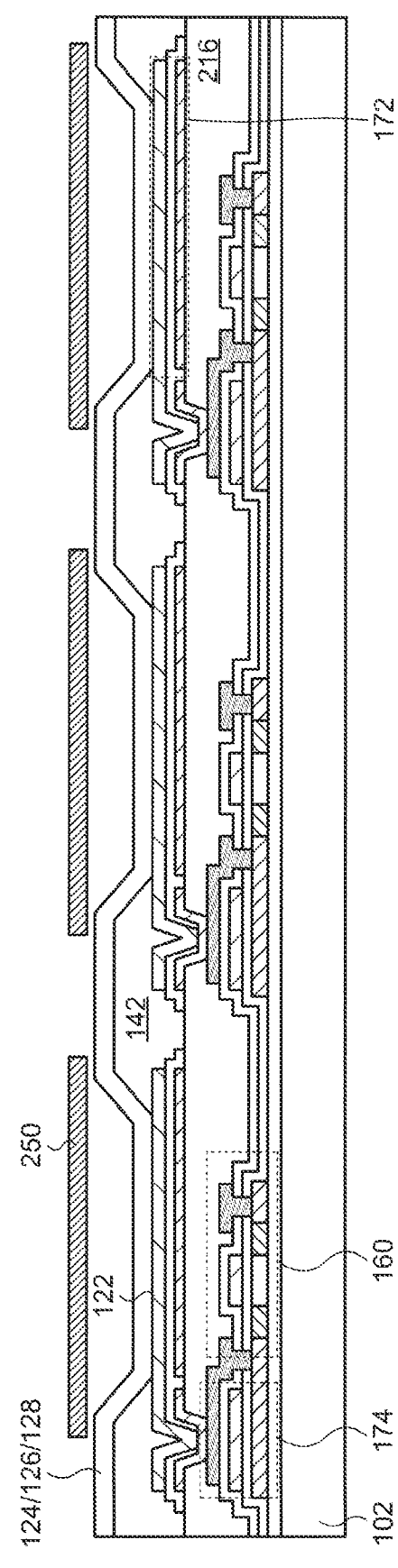

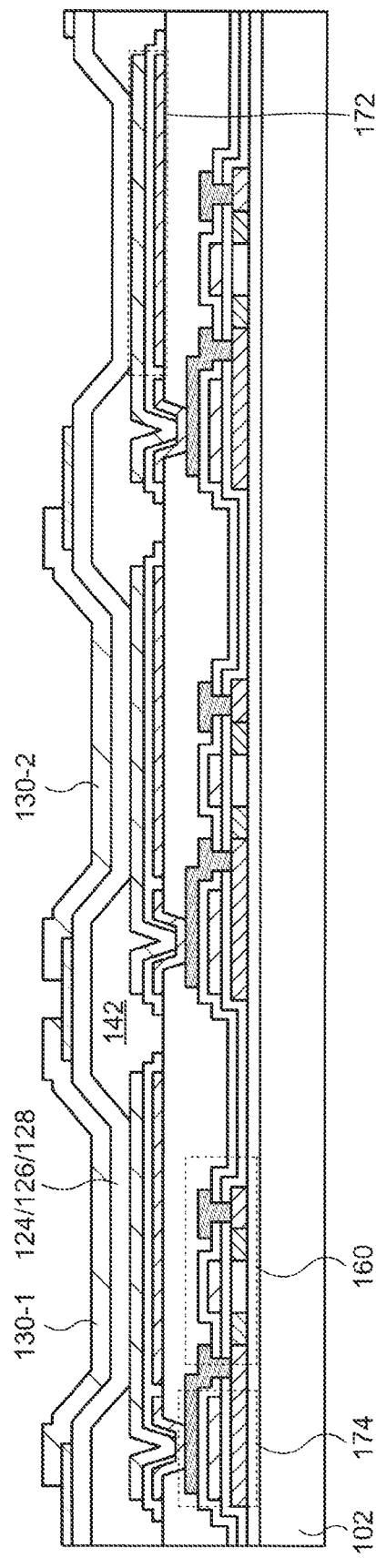
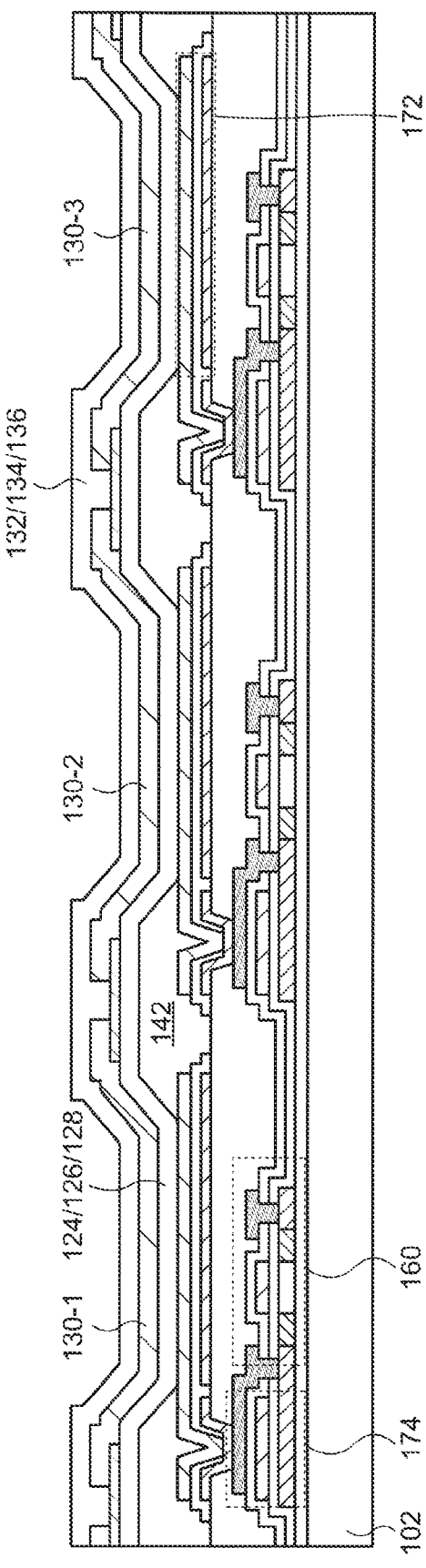

DISPLAY DEVICE

CROSS REFERENCE TO RELATED APPLICATIONS

This application is based on and claims the benefit of priority from the prior Japanese Patent Application No. 2018-082827, filed on Apr. 24, 2018, the entire contents of which are incorporated herein by reference.

FIELD

An embodiment of the present invention relates to a display device having a light-emitting element and a manufacturing method thereof.

BACKGROUND

As an example of a display device, an organic EL (Electroluminescence) display device utilizing the electroluminescence of an organic compound is represented. An organic EL display device has a plurality of pixels each provided with an electroluminescent element (hereinafter, referred to as a light-emitting element) over a substrate, and the light-emitting element possesses a pair or electrodes (a pixel electrode and an opposing electrode) and an electroluminescent layer (hereinafter, referred to as an EL layer) sandwiched therebetween. When a current is supplied between the pair of electrodes, carriers (holes and electrons) are injected to the EL layer from these electrodes, by which the holes and electrons are recombined in the EL layer resulting in an excited state. Energy generated in a relaxation process from the excited state to a ground state is extracted as light emission, thereby realizing a function as a display device.

In most display devices, the pixel electrode is independently formed in each pixel, while the opposing electrode is continuously provided over a plurality of pixels. Thus, a region where one of the carriers (e.g. holes) is injected is an interface between the EL layer and the pixel electrode, which corresponds to an emission region of each pixel. A structure for selectively obtaining light emission from the emission region in each pixel is proposed in Japanese Patent Application Publications No. 2016-85913 and No. 2016-103395.

SUMMARY

An embodiment of the present invention is a display device. The display device possesses a first pixel, a second pixel adjacent to the first pixel, a partition wall, and an emission-quenching layer. The first pixel includes a first pixel electrode, a first emission layer located over the first pixel electrode and containing a first emission material, and an opposing electrode over the first emission layer. The second pixel includes a second pixel electrode, a second emission layer located over the second pixel electrode and containing a second emission material, and the opposing electrode over the second emission layer. The partition wall is located between the first pixel and the second pixel and covers an edge portion of the first pixel electrode and an edge portion of the second pixel electrode. The emission-quenching layer is sandwiched by the partition wall and the opposing electrode and contains at least one of the first emission material and the second emission material at a concentration higher than at least one of a concentration of the first emission material in the first emission layer and a concentration of the second emission material in the second emission layer.

An embodiment of the present invention is a display device. The display device possesses a first pixel, a second pixel adjacent to the first pixel, a partition wall, a first emission-quenching layer, and a second emission-quenching layer. The first pixel includes a first pixel electrode, a first emission layer located over the first pixel electrode and containing a first emission material, and an opposing electrode over the first emission layer. The second pixel includes a second pixel electrode, a second emission layer located over the second pixel electrode and containing a second emission material, and the opposing electrode over the second emission layer. The partition wall is located between the first pixel and the second pixel and covers an edge portion of the first pixel electrode and an edge portion of the second pixel electrode. The first emission-quenching layer is sandwiched by the partition wall and the opposing electrode and contains the first emission material at a concentration higher than a concentration of the first emission material in the first emission layer. The second emission-quenching layer is sandwiched by the partition wall and the opposing electrode and contains the second emission material at a concentration higher than a concentration of the second emission material in the second emission layer.

BRIEF DESCRIPTION OF DRAWINGS

FIG. 17A and FIG. 17B. are schematic cross-sectional views showing a manufacturing method of a display device according to an embodiment of the present invention;

FIG. 19A and FIG. 19B. are schematic cross-sectional views showing a manufacturing method of a display device according to an embodiment of the present invention.

DESCRIPTION OF EMBODIMENTS

Figure 1:
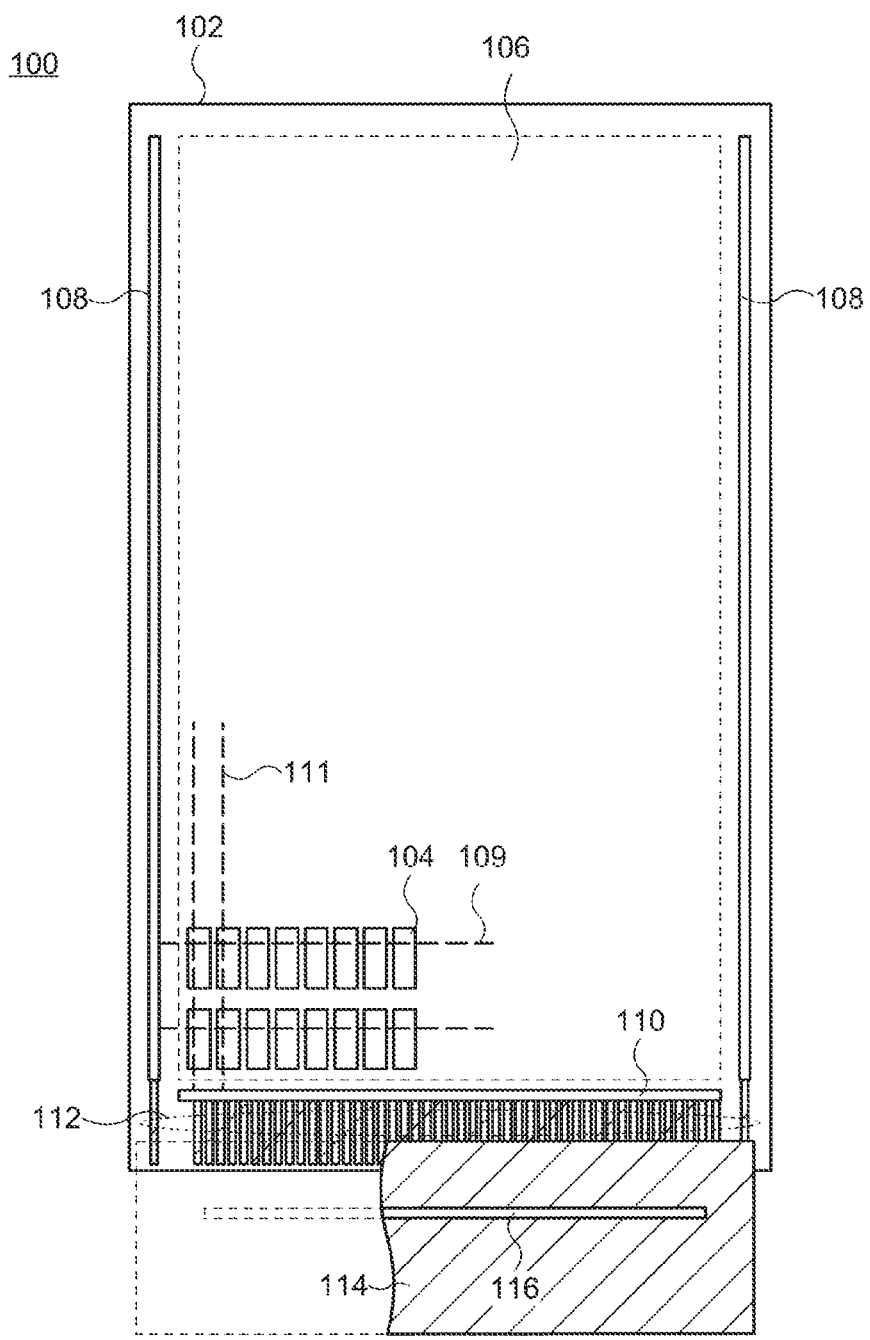
FIG. 1 is a schematic top view of a display device according to an embodiment of the present invention.

Hereinafter, each embodiment of the present invention is explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present specification and claims, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the specification and the claims, an expression "a structure is exposed from another structure" means a mode in which a part of the structure is not covered by the other structure and includes a mode where the part uncovered by the other structure is further covered by another structure.

In the specification and drawings, the same reference numeral is used when a plurality of the same or similar structures are collectively expressed, and a hyphen and a natural number are further used when each of these plural structures is distinctively expressed.

First Embodiment

In the present embodiment, a structure of a display device 100 according to an embodiment of the present invention is explained.

1. Outline Structure

A schematic top view of the display device 100 is shown in FIG. 1. The display device 100 possesses a substrate 102 and a variety of patterned insulating films, semiconductor films, and conductive films thereover. A plurality of pixels 104, driver circuits (scanning-line driver circuits 108 and signal-line driver circuit 110) for driving the pixels 104, a variety of wirings 109 and 111 electrically connecting the driver circuits and the pixels 104, and the like are formed with these insulating films, semiconductor films, and conductive films. A display region 106 is defined by the plurality of pixels 104. As described below, a light-emitting element 120 is disposed in each pixel 104.

The scanning-line driver circuits 108 and the signal-line driver circuit 110 are arranged outside the display region (peripheral region or frame region) 106. The wirings 109 formed with the patterned conductive films extend to the display region 106 from the scanning-line driver circuits 108 and are electrically connected to the plurality of pixels 104. Similarly, the wirings 111 extend to the display region 106 from the signal-line driver circuit 110 and are electrically connected to the plurality of pixels 104. As described below, a plurality of wirings extending to the display region 106 from the scanning-line driver circuits 108 and a plurality of wirings extending to the display region 106 from the signal-line driver circuit 110 are collectively illustrated as wirings 109 and 111, respectively, in FIG. 1.

A variety of wirings 112 also extends to a side of the substrate 102 from the display region 106, the scanning-line driver circuits 108, and the signal-line driver circuit 110 and is exposed at a vicinity of an edge portion of the substrate 102 to form terminals (not illustrated). The terminals are electrically connected to a flexible printed-circuit board (FPC) 114. In the example shown here, a driver IC 116 including an integrated circuit formed over a semiconductor substrate is further mounted on the FPC 114. Image signals and a power source are supplied from an external circuit (not illustrated) through the driver IC 116 and the FPC 114 and are provided to the display region 106, the scanning-line driver circuits 108, and the signal-line driver circuit 110 through the wirings 112. The mode of the driver circuits and the driver IC 116 is not limited to that shown in FIG. 1: the driver IC 116 may be mounted on the substrate 102, or the function of the signal-line driver circuit 110 may be integrated to the driver IC 116, for example.

2. Light-Emitting Element

Figure 2:
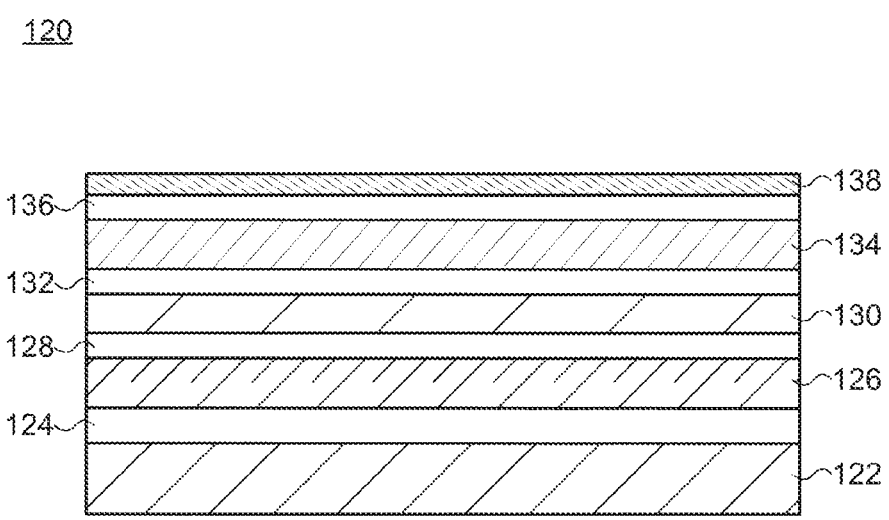
FIG. 2. is a schematic cross-sectional view of a light-emitting element of a display device according to an embodiment of the present invention.

A structure of the light-emitting element 120 is shown as a schematic cross-sectional view in FIG. 2. Here, the structures such as the substrate 102 supporting the light-emitting element 120 are not illustrated. The light-emitting element 120 possesses, as a fundamental structure, a pixel electrode 122, an opposing electrode 138 over the pixel electrode 122, and a plurality of functional layers arranged between the pixel electrode 122 and the opposing substrate 138. FIG. 2 shows the light-emitting element 120 including, as the functional layers, a hole-injection layer 124, a hole-transporting layer 126, an electron-blocking layer 128, an emission layer 130, a hole-blocking layer 132, an electron-transporting layer 134, and an electron-injection layer 136 arranged in this order from the pixel electrode 122 side. A layer having another function (e.g., an exciton-blocking layer, a charge-generating layer, or the like) may be included in addition to these functional layers. Alternatively, a part of these functional layers may not be provided. Each functional layer may have a single-layer structure or a stacked-layer structure. In the present specification and claims, the plurality of functional layers arranged between the pixel electrode 122 and the opposing electrode 138 is collectively called an EL layer.

2-1. Pixel Electrode

When the pixel electrode 122 functions as an anode, the opposing electrode 138 functions as a cathode, while the opposing electrode 138 functions as an anode when the pixel electrode 122 functions as a cathode. Hereinafter, an example is explained where the pixel electrode 122 functions as an anode.

The pixel electrode 122 is provided to inject holes to the EL layer and is preferred to have a surface with a relatively high work function. As a specific material, a conductive oxide capable of transmitting visible light, such as indium-tin oxide (ITO) and indium-zinc oxide (IZO), is represented. When light emission obtained from the emission layer 130 is extracted through the pixel electrode 122, the light-emission can be efficiently extracted by using a light-transmitting conductive oxide. On the other hand, the pixel electrode 122 may include a film containing a metal, such as silver and aluminum, having a high reflectivity to visible light when the light-emitting element 120 has a structure in which the light-emission obtained from the emission layer 130 is extracted through the opposing electrode 138. For example, the pixel electrode 122 may have a stacked-layer structure in which a conductive film including a metal such as silver and aluminum is sandwiched by conductive films including a conductive oxide.

When a conductive film containing a material capable of transmitting visible light is used in the whole or in a part of the pixel electrode 122 and the pixel electrode 122 is configured so that this conductive film is in contact with the EL layer, this conductive film can be utilized for optical adjustment. As a result, the shape of the emission spectrum as well as luminance in a front direction of the light-emitting element 120 can be precisely adjusted.

2-2. Hole-Injection Layer

It is possible to use a compound to which holes are readily injected, that is, a compound readily oxidized (an electron-donating compound) for the hole-injection layer 124. In other words, a compound with a shallow highest occupied molecular orbital (HOMO) level can be used. For example, an aromatic amine such as a benzidine derivative and a triarylamine, a carbazole derivative, a thiophene derivative, and a phthalocyanine derivative such as copper phthalocyanine, and the like can be used. Alternatively, a polythiophene derivative or a polyaniline derivative can be used, and poly(2,3-ethylenedioxythiophene)/poly(styrenesulfonic acid) is represented as an example. Alternatively, a mixture of an electron-donating compound such as the aforementioned aromatic amine and carbazole derivative as well as an aromatic hydrocarbon with an electron acceptor may be used. As an electron acceptor, a transition-metal oxide such as vanadium oxide and molybdenum oxide, a nitrogen-containing heteroaromatic compound, a heteroaromatic compound having a strong electron-withdrawing group such as a cyano group, and the like are represented. These materials and the mixtures exhibit a small hole-injection barrier from the pixel electrode 120 because they have a low ionization potential. Thus, these materials and the mixture contribute to the reduction of the driving voltage of the light-emitting element 120.

1-3. Hole-Transporting Layer

The hole-transporting layer 126 has a function to transport holes injected to the hole-injection layer 124 from the pixel electrode 122 to a side of the emission layer 130, and materials the same as or similar to the materials usable in the hole-injection layer 124 can be used. For example, it is possible to use a material having a HOMO level deeper than that of the hole-injection layer 124 by approximately 0.5 eV or less or 0.3 eV or less. Since the materials described above have a hole-transporting property higher than an electron-transporting property, the holes are efficiently transported to the side of the emission layer 130, by which a low driving voltage of the light-emitting element 120 can be realized.

2-4. Electron-Blocking Layer

The electron-blocking layer 128 has a function to inhibit electrons injected form the opposing electrode 138 from passing through the emission layer 130 and being injected to the hole-transporting layer 126 without contributing to recombination so as to confine the electrons in the emission layer 130 and to prevent energy transfer from an excited state obtained in the emission layer 130 to the molecules in the hole-transporting layer 126. Therefore, a material is preferred which has a hole-transporting property larger than or similar to an electron-transporting property, which has a lowest unoccupied molecular orbital (LUMO) level shallower than that of the molecules in the emission layer 130, and which has a large band gap. Specifically, it is preferred that a difference in the LUMO level between the molecules included in the electron-blocking layer 128 and the molecules included in the emission layer 130 be equal to or more than 0.2 eV, equal to or more than 0.3 eV, or equal to or more than 0.5 eV. In addition, a difference in a band gap between the molecules included in the electron-blocking layer 128 and the molecules included in the emission layer 130 is preferred to be equal to or more than 0.2 eV, equal to or more than 0.3 eV, or equal to or more than 0.5 eV. In the case where an emission material is a phosphorescent material, it is preferred to use a material having a triplet level higher than that of the emission material by equal to or more than 0.2 eV, equal to or more than 0.3 eV, or equal to or more than 0.5 eV. More specifically, a carbazole derivative, an arylamine derivative, a thiophene derivative, or the like having a relatively small conjugation system is represented.

2-5. Emission Layer

The emission layer 130 is a layer supplying a space for recombination of the holes and electrons, and the light emission is obtained from this layer. The emission layer 130 has a so-called host-guest type structure. As the host material, a stillbene derivative, a condensed aromatic compound such as an anthracene derivative, a carbazole derivative, a metal complex including a quinolinol ligand, an aromatic amine, a nitrogen-containing heteroaromatic compound such as a phenanthroline derivative, and the like can be used, for example. The guest functions as the emission material in the emission layer 130, and a fluorescent material such as a coumarin derivative, a pyran derivative, a quinacridone derivative, a tetracene derivative, a pyrene derivative, and an anthracene derivative or a phosphorescent material such as an iridium-based orthometal complex can be used. The emission layer 130 is configured so that a bad gap of the host material is larger than a band gap of the emission material.

2-6. Hole-Blocking Layer

The hole-blocking layer 132 has a function to inhibit the holes injected form the pixel electrode 122 from passing through the emission layer 130 and being injected to the electron-transporting layer 134 without contributing to recombination so as to confine the holes in the emission layer 130 and to prevent energy transfer from an excited state obtained in the emission layer 130 to the molecules in the electron-transporting layer 134. It is preferred to use, for the hole-blocking layer 132, a material which has an electron-transporting property higher than or similar to a hole-transporting property, which has a HOMO level deeper than that of the molecules in the emission layer 130, and which has a large band gap. Specifically, it is preferred that a difference in the HOMO level between the molecules included in the hole-blocking layer 132 and the molecules included in the emission layer 130 be equal to or more than 0.2 eV, equal to or more than 0.3 eV, or equal to or more than 0.5 eV. Furthermore, it is preferred that a difference in the band gap between the molecules included in the hole-blocking layer 132 and the molecules included in the emission layer 130 be equal to or more than 0.2 eV, equal to or more than 0.3 eV, or equal to or more than 0.5 eV. When the emission material is a phosphorescent material, it is preferred to use a material having a triplet level higher than that of the emission material by equal to or more than 0.2 eV, equal to or more than 0.3 eV, or equal to or more than 0.5 eV. More specifically, a phenanthroline derivative, an oxadiazole derivative, a triazole derivative, a metal complex with a relatively large band gap (e.g., equal to or more than 2.8 eV) such as bis(2-methyl-8-qunolinolato)(4-hydroxybiphenyl)aluminum, and the like are represented.

2-7. Electron-Transporting Layer

The electron-transporting layer 134 has a function to transport the electrons injected from the opposing electrode 138 to the electron-injection layer 136 to the emission layer 130 side. A compound having an electron-transporting property is a compound having an electron-transporting property higher than a hole-transporting property and is selected from a metal complex including a ligand having an 8-qunolinole ligand as a basic skeleton, a nitrogen-containing heteroaromatic compound such as an oxadiazole derivative, a triazole derivative, and a phenanthroline derivative, a silacyclopentadiene derivative, an aromatic hydrocarbon such as an anthracene derivative, a pyrene derivative, and a perylene derivative, and the like, for example. As the aforementioned complex, tris(8-quinolinolato)aluminum (Alq), (8-quinolinolato)lithium, and the like are exemplified.

2-8. Electron-Injection Layer

The electron-injection layer 136 has a function to promote electron injection from the opposing electrode 138 to the EL layer. For example, a metal fluoride such as calcium fluoride and lithium fluoride as well as a Group 1 metal and a Group 2 element such as lithium, calcium, and magnesium can be used. Alternatively, a mixture of a material usable for the electron-transporting layer 134 with an electron donor may be used. As an electron donor, a Group 1 metal, a Group 2 element, a lanthanide metal such as ytterbium, and the like are represented.

2-9. Opposing Electrode

The opposing electrode 138 is an electrode functioning to inject electrons to the EL layer, which is formed over and shared by the plurality of pixels 104. A material with a relatively low work function and a high conductivity is used for the opposing electrode 138. When the light emission from the emission layer 130 is extracted through the opposing electrode 138, a conductive oxide capable of transmitting visible light is used. Alternatively, silver, magnesium, or an alloy thereof may be used. In this case, the opposing electrode 138 is formed to have a thickness allowing at least a part of visible light to pass therethrough. A layer of a conductive oxide may be stacked over a thin film including such a metal. In the case where the light emission from the emission layer 130 is extracted from the pixel electrode 122, the opposing electrode 138 may be formed using a metal having a high reflectivity, such as aluminum, silver, and magnesium, at a thickness which does not allow visible light to pass therethrough.

3. Emission-Quenching Layer 3-1. Structure

Figure 3:
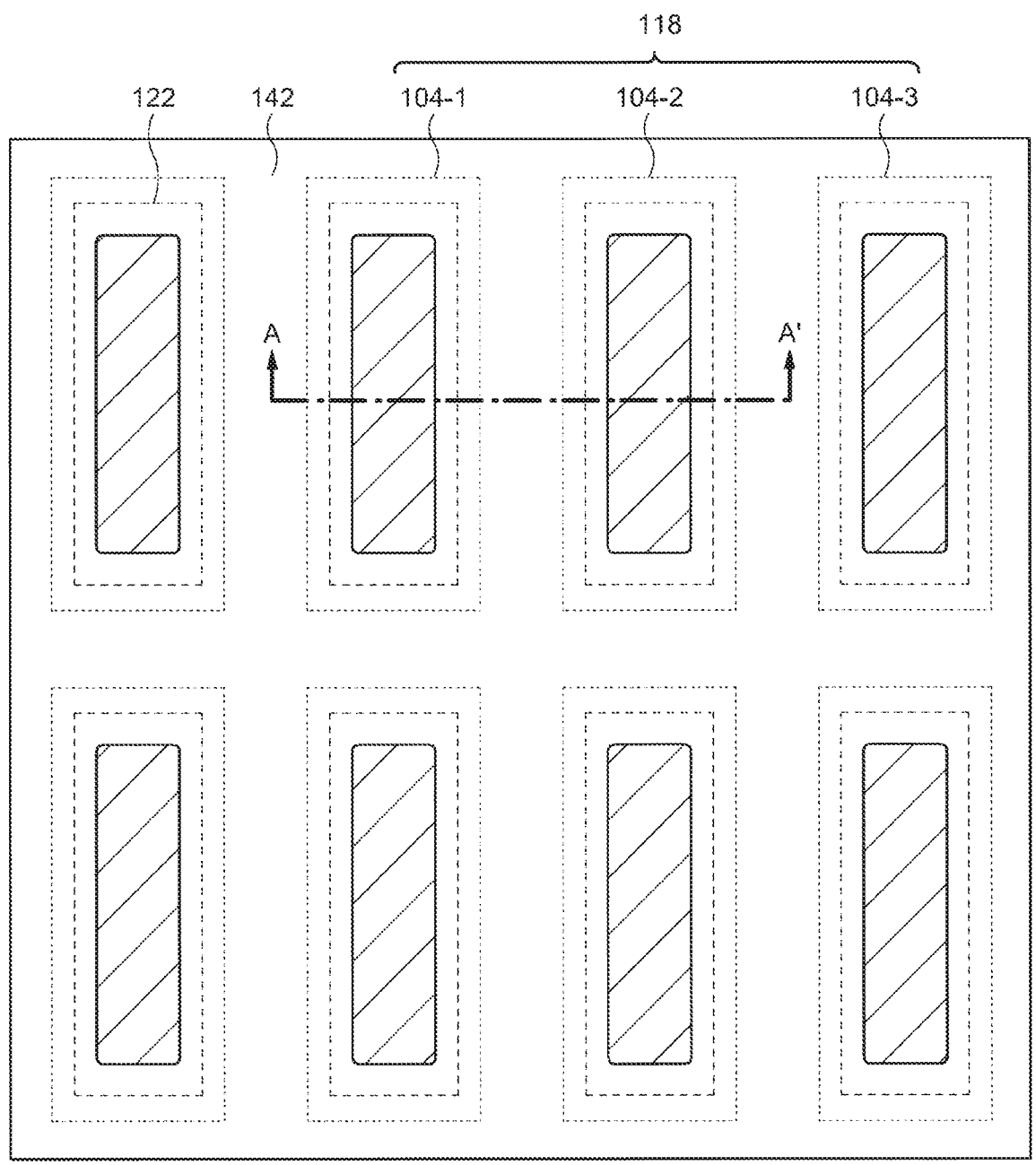
FIG. 3 is a schematic top view of a display device according to an embodiment of the present invention.
Figure 4A:
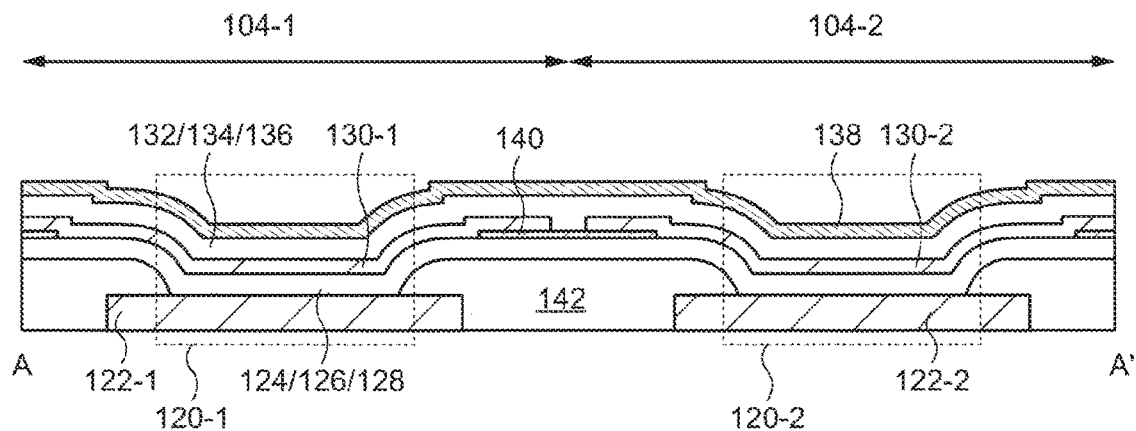
FIG. 4A to FIG. 4C. are schematic cross-sectional views of a light-emitting element of a display device according to an embodiment of the present invention.

An enlarged schematic view of the display region 106 is shown in FIG. 3, and a schematic view of a cross section along a dotted line A-A in FIG. 3 is shown in FIG. 4A. The structures above the partition wall 142 are omitted for visibility in FIG. 3 (see FIG. 4A), and a part of the plurality of functional layers is illustrated as a single film in FIG. 4A.

As shown in FIG. 3, the pixels 104 are periodically disposed and arranged in a matrix form composed of a plurality of rows and columns. The light-emitting elements 120 are configured so that the pixels 104 adjacent in the row direction provide a different emission color. Specifically, the emission materials included in the emission layers 130 are different between the light-emitting elements 120 included in the adjacent pixels 104. The light-emitting elements 120 included in a series of three pixels 104 are configured to provide emission colors different from one another and respectively emit three primary colors, by which full-color display can be performed. In this case, a pixel group 118 is formed by the series of three pixels 104. Hereinafter, three pixels 104 included in one pixel group 118 and providing different emission colors are respectively referred to as a first pixel 104-1, a second pixel 104-2, and a third pixel 104-3, whereas the light-emitting elements 120 included in these pixels 104 are respectively referred to as a first light-emitting element 120-1, a second light-emitting element 120-2, and a third light-emitting element 120-3. The emission layers 130 of these light-emitting elements 120 are respectively referred to as a first emission layer 130-1, a second emission layer 130-2, and a third emission layer 130-3. Note that, in the following explanation, an example is explained where wavelengths of emissions obtained from the first emission layer 130-1, the second emission layer 130-2, and the third emission layer 130-3 become long in this order. In such an example, the first emission layer 130-1, the second emission layer 130-2, and the third emission layer 130-3 may respectively provide blue, green, and red emissions, for example. In the present specification and claims, blue, green, and red regions are respectively a wavelength region equal to or longer than 400 nm and shorter than 500 nm, a wavelength region equal to or longer than 500 nm and shorter than 600 nm, and a wavelength region equal to or longer than 600 nm and equal to or shorter than 780 nm, and blue, green, and red missions are the emissions having at least one emission peak in the aforementioned regions, respectively. Therefore, the emission-peak wavelength of the emission material included in the second emission layer 130 is longer than that of the emission material included in the first emission layer 130-1 and longer than that of the emission material included in the third emission layer 130-3.

As shown in FIG. 4A, the partition wall 142 is disposed over the pixel electrodes 122. The partition wall 142 is an insulating film having a plurality of openings exposing the pixel electrodes 122 and covers an edge portion of each pixel electrode 122. The EL layer is arranged to overlap the pixel electrodes 122 and the partition wall 142 and is in contact with the pixel electrodes 122 in the openings of the partition wall 142. Hence, the opening of the partition wall 142, that is, the interface at which the pixel electrode 122 and the EL layer are in contact with each other is an emission region of each pixel 104. The opposing electrode 138 is shared by the plurality of light-emitting elements 120.

As shown in FIG. 4A, the display device 100 further possesses an emission-quenching layer 140 over the partition wall 142 located between adjacent pixels (here, the first pixel 104-1 and the second pixel 104-2). The emission-quenching layer 140 is sandwiched by the partition wall 142 and the opposing electrode 138 between the adjacent pixels 104. In the example demonstrated in FIG. 4A, the emission-quenching layer 140 is sandwiched between the partition wall 142 and the first emission layer 130-1 and between the partition wall 142 and the second emission layer 130-2. The emission-quenching layer 140 may be in contact with the first emission layer 130-1 and the second emission layer 130-2. The emission-quenching layer 140 may not overlap with the pixel electrode 122 or may partly overlap with the pixel electrode 122.

The emission-quenching layer 140 includes at least one of the emission material included in the first emission layer 130-1 and the emission material included in the second emission layer 130-2. Moreover, a concentration of the emission material in the emission-quenching layer 140 is higher than a concentration of the emission material in the first emission layer 130-1 or a concentration of the emission material in the second emission layer 130-2. For example, the concentrations of the emission materials in the emission layers 130 may be appropriately selected from a range equal to or higher than 1 vol % and equal to or lower than 15 vol %, equal to or higher than 3 vol % and equal to or lower than 15 vol %, or equal to or higher than 5 vol % and equal to or lower than 10 vol %, while the concentration of the emission material in the emission-quenching layer 140 may be selected from a range equal to or higher than 20 vol % and equal to or lower than 100 vol %, equal to or higher than 30 vol % and equal to or lower than 100 vol %, or equal to or higher than vol % and equal to or lower than 100 vol %. The emission-quenching layer 140 may consist of the emission material in the first emission layer 130-1 or the emission material in the second emission layer 130-2.

A thickness of the emission-quenching layer 140 is adjusted to be equal to or larger than 2% and equal to or smaller than 10%, equal to or larger than 5% and equal to or smaller than 10%, or equal to or larger than 2% and equal to or smaller than 5% of the thicknesses of the emission layers 130. For example, when the emission-quenching layer 140 contains the emission material included in the first emission layer 130-1, the thickness of the emission-quenching layer 140 may be set in the aforementioned range using the first emission layer 130-1 as a standard. Similarly, when the emission-quenching layer 140 contains the emission material included in the second emission layer 130-2, the thickness of the emission-quenching layer 140 may be set in the aforementioned range using the second emission layer 130-2 as a standard.

3-2. Arrangement

Figure 5A:
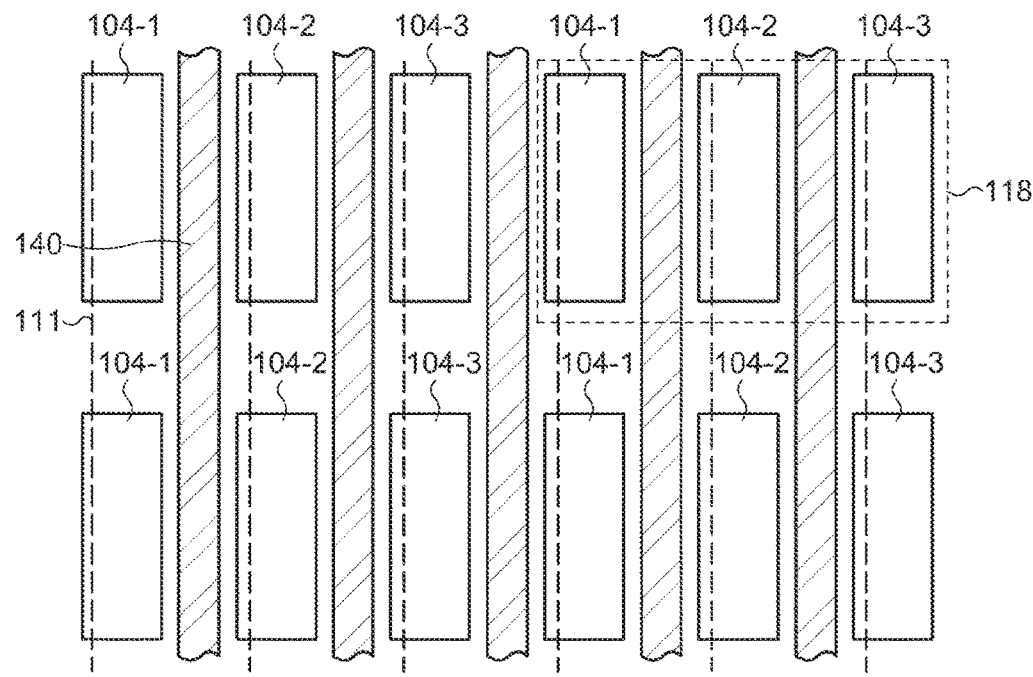
FIG. 5A and FIG. 5B are schematic top views of a display device according to an embodiment of the present invention.

FIG. 5A shows a schematic top view of the display device 100. In this drawing, a positional relationship between the pixels 104 and the emission-quenching layers 140 is schematically illustrated. As shown in FIG. 5A, a plurality of emission-quenching layers 140 may be arranged in a stripe form. Each emission-quenching layer 140 extends between the adjacent pixels 104. As described above, the wirings 109 extend to the display region 106 from the scanning-line driver circuits 108, and each wiring 109 is electrically connected to the plurality of pixels 104 arranged in the row direction. Similarly, the wirings 111 extend to the display region 106 from the signal-line driver circuit 110, and each wiring 111 is electrically connected to the plurality of pixels 104 arranged in the column direction (see FIG. 1). Therefore, the emission-quenching layers 104 are arranged to extend parallel to the wirings 111 (that is, in the column direction of the pixels 104) in the example demonstrated in FIG. 5A.

Figure 5B:
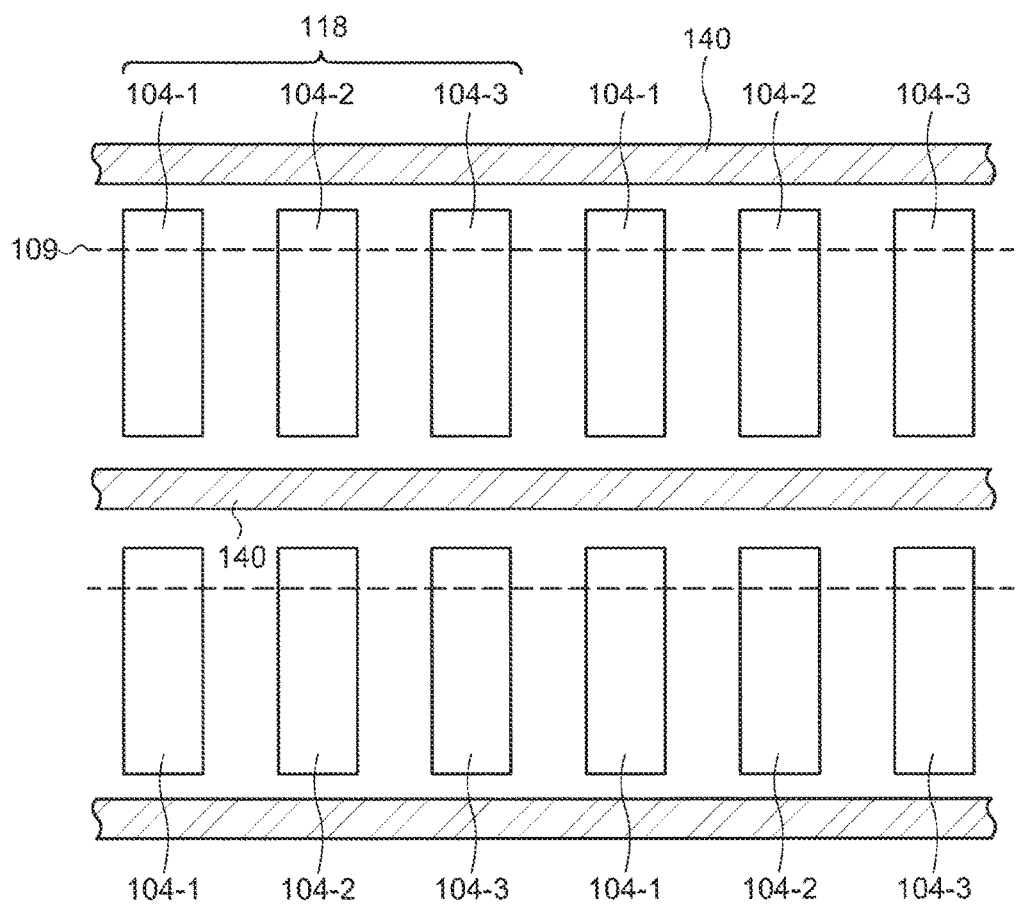
Figure 6A:
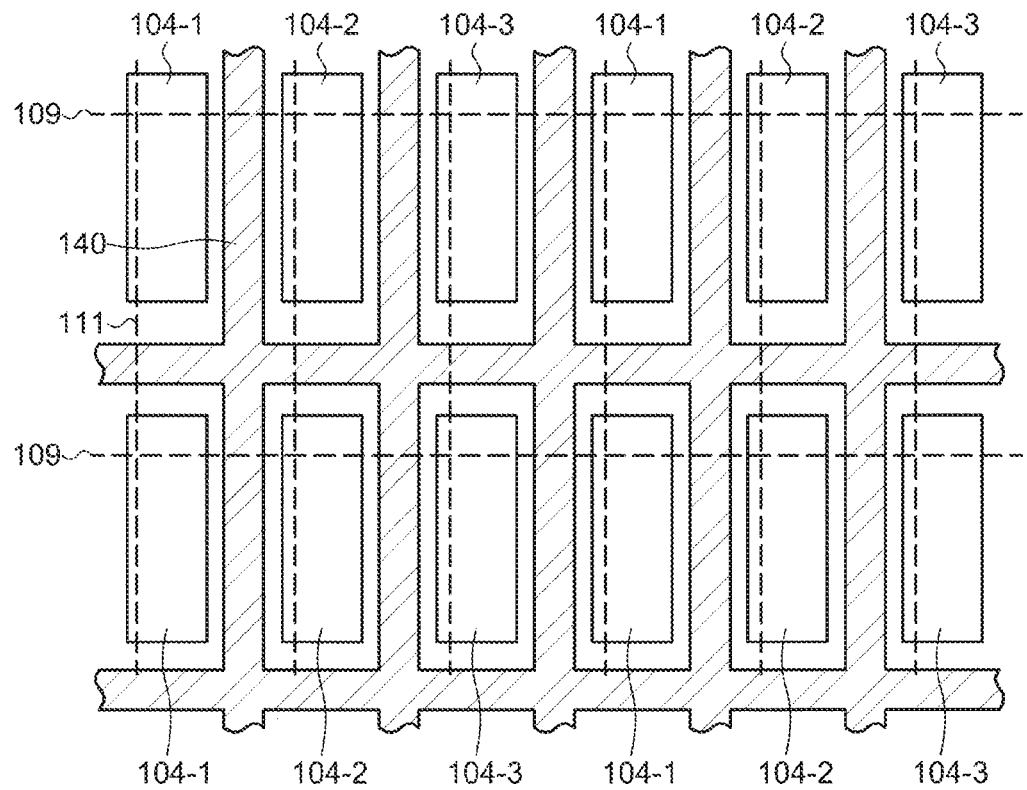
FIG. 6A and FIG. 6B are schematic top views of a display device according to an embodiment of the present invention.
Figure 6B:
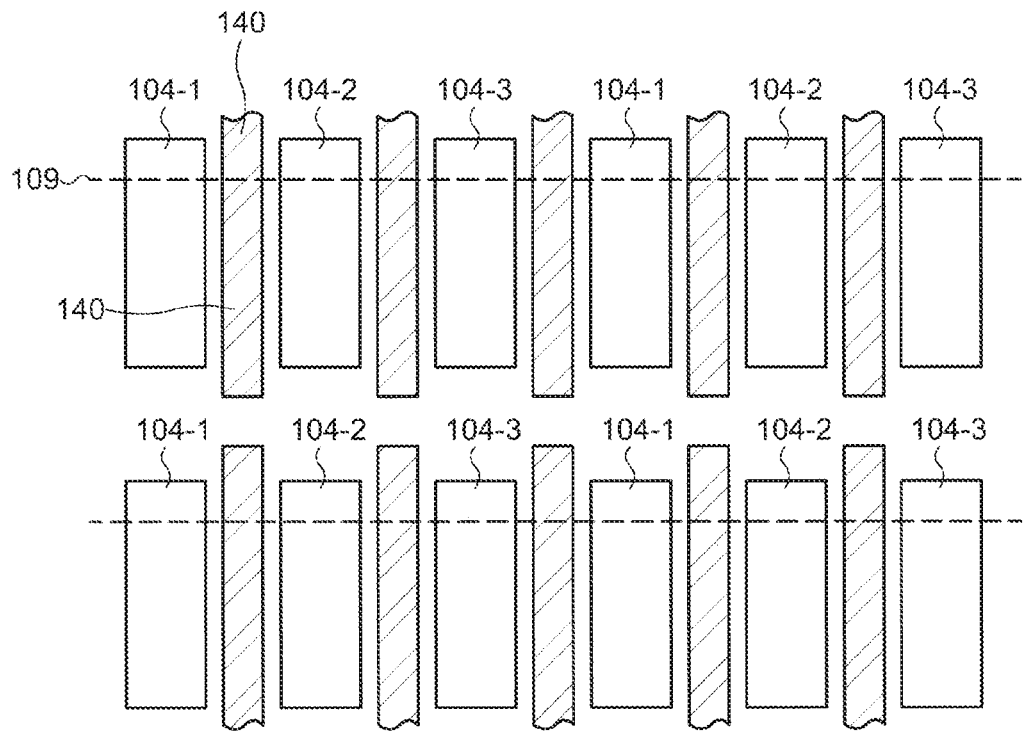

The arrangement of the emission-quenching layers 140 is not limited to that shown in FIG. 5A, and the emission-quenching layers 140 may be arranged parallel to the wirings 109 (that is, in the row direction of the pixels 104) as shown in FIG. 5B. Alternatively, the emission-quenching layer 140 may be arranged in a matrix form so as to have a portion parallel to the wirings 109 and a portion parallel to the wirings 111 as shown in FIG. 6A. In this case, the pixel 104 is surrounded by the emission-quenching layer 140. As described below in detail, a thickness of a portion where the portion parallel to the wirings 109 intersects the portion parallel to the wirings 111 is a summation of the thicknesses of the portion parallel to the wirings 109 and the portion parallel to the wirings 111 in this arrangement. Alternatively, the emission-quenching layers 140 may be divided between the adjacent pixel rows and between the adjacent pixel columns as shown in FIG. 6B. In the arrangement shown in FIG. 6B, the emission-quenching layers 140 are divided between the adjacent pixel rows.

Figure 7:
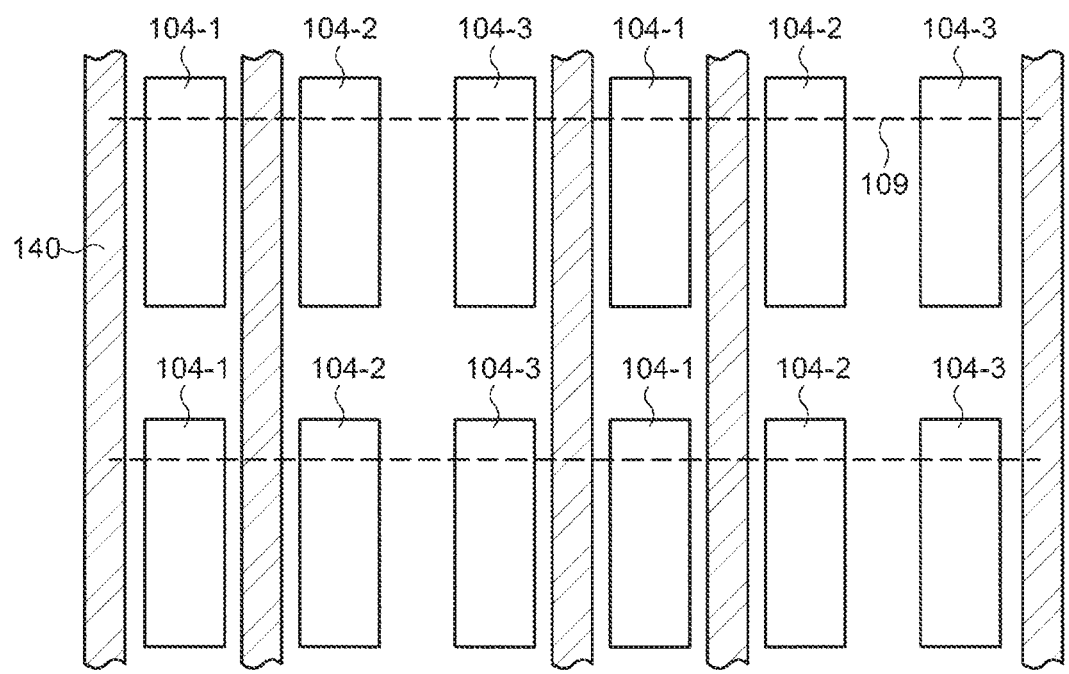
FIG. 7 is a schematic top view of a display device according to an embodiment of the present invention.

Moreover, it is not always necessary to arrange the emission-quenching layers 140 in all the regions between the adjacent pixels 104, and the plurality of pixels 104 may be arranged between the adjacent emission-quenching layers 140 in one row or in one column as shown in FIG. 7. In the arrangement shown in FIG. 7, the emission-quenching layers 140 are disposed between the first pixel 104-1 and the second pixel 104-2 and between the third pixel 104-3 and the first pixel 104-1, while the emission-quenching layer 104 is not provided between the second pixel 104-2 and the third pixel 104-3. Such a configuration is more effective in the case where the first light-emitting element 120-1 has an emission threshold voltage higher than those of the second light-emitting element 120-2 and the third light-emitting element 120-3 (for example, the case where the first light-emitting element 120-1 provides the shortest emission wavelength).

3-3. Suppression of Secondary Emission

In the display device 100 having the structure mentioned above, it is possible to effectively prevent or suppress a decrease in display quality caused by a leak current, by which display with excellent color purity and a wide color gamut can be realized. This effect is explained below.

Figure 4B:
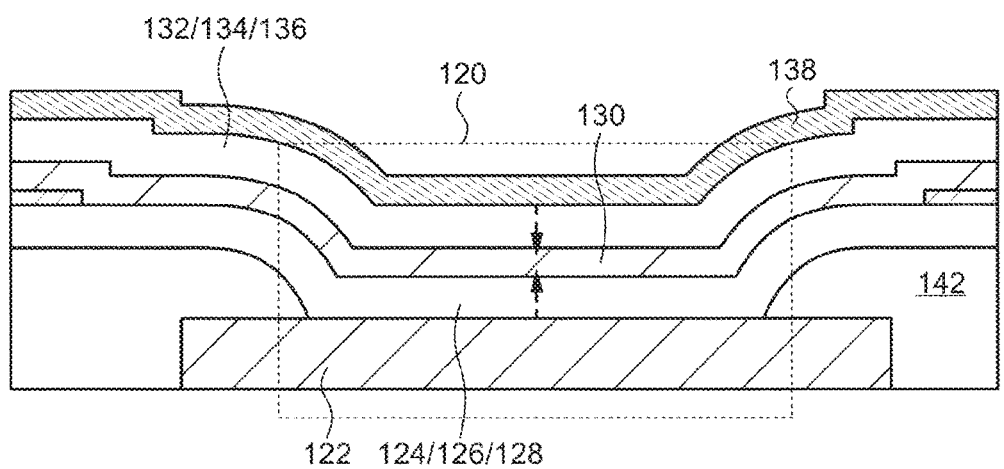

FIG. 4B shows a schematic cross-sectional view in which one light-emitting element 120 is centered. When a potential difference exceeding the emission threshold voltage is applied between the pixel electrode 122 and the opposing electrode 138, the holes and electrons are respectively injected from the pixel electrode 122 and the opposing electrode 138 as indicted by the dotted arrows. The holes are transported to the emission layer 130 through the hole-injection layer 124, the hole-transporting layer 126, the electron-blocking layer 128, and the like. The electrons are transported to the emission layer 130 through the electron-injection layer 136, the electron-transporting layer 134, the hole-blocking layer 132, and the like. The holes and electrons are recombined in the emission layer 130, resulting in an excited state of the emission material included in the emission layer 130. When the excited state relaxes to the ground state through the radiative deactivation process, light corresponding to an energy difference therebetween is obtained.

Since the holes and electrons are transported in the EL layer as described above, a current flows between the pixel electrode 122 and the opposing electrode 138 through the EL layer. This current is called a space-charge-limited current and flows to the opposing electrode 138 from the pixel electrode 122 in a perpendicular direction to the surface of the pixel electrode 122. A magnitude of a space-charge-limited current is inversely proportional to a cube of a film thickness (here, the thickness of the EL layer). Hence, the space-charge-limited current cannot flow in the EL layer in a parallel direction to the surface of the pixel electrode 122, and the Ohmic rule is substantially applied to the current flowing in this direction. Generally, each layer structuring the EL layer only has a conductivity of an extent regarded as that of an insulating film. Thus, the Ohmic current flowing in the parallel direction to the surface of the pixel electrode 122 can generally be neglected. Accordingly, the injected holes and electrons are not transported to the adjacent pixels 104 and over the partition wall 142, and the light emission is selectively obtained from the emission region of the selected pixel 104.

However, if a carrier-transporting property in all of or a part of the layers structuring the EL layer is significantly increased, the Ohmic current cannot be ignored. Particularly, when the width of the partition wall 142 is reduced and the distance between the adjacent pixels 104 is decreased in order to increase the resolution of a display device, the influence of the Ohmic current cannot be ignored, and a leak current flows. This phenomenon is explained using FIG. 8.

Figure 8:
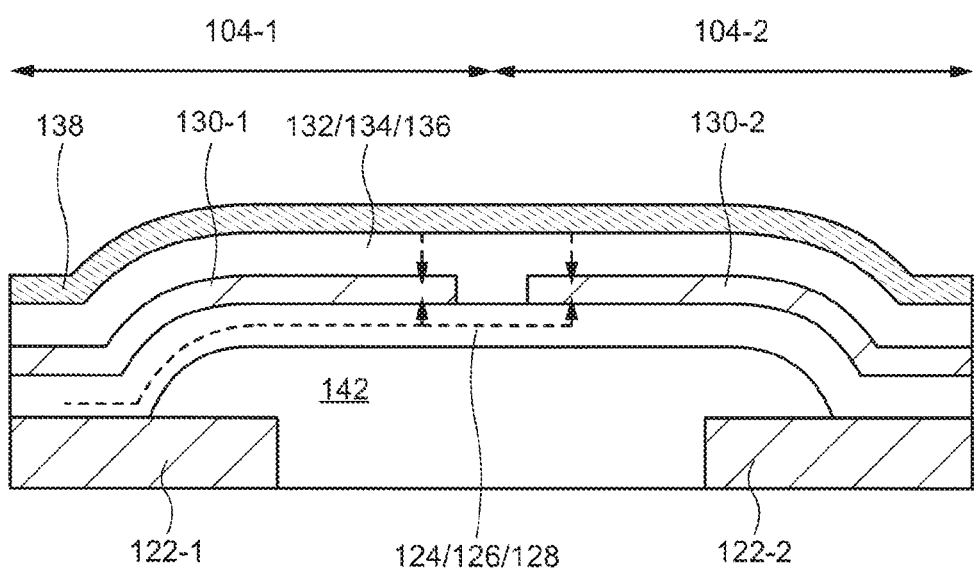
FIG. 8. is a schematic cross-sectional view of a conventional light-emitting element.

FIG. 8 is a schematic cross-sectional view in which the partition wall 142 positioned between two adjacent light-emitting elements (first light-emitting element 120-1 and the second light-emitting element 120-2) of a display device according to the prior art is centered. In the conventional structure, the emission-quenching layer 140 is not disposed. Here, a state is considered where only the first pixel 104-1 is operated to emit light whereas the second pixel 104-2 is maintained in a non-emitting state. Specifically, a potential difference larger than the emission threshold voltage of the first light-emitting element 120-1 is supplied between the pixel electrode 122-1 of the first light-emitting element 120-1 and the opposing electrode 138, while the voltage between the pixel electrode 122-2 of the second light-emitting element 120-2 and the opposing electrode 138 is set to be smaller than the emission threshold voltage. In this case, a part of the holes injected from the pixel electrode 122-1 is transported over the partition wall 142 through the hole-injection layer 124 and the hole-transporting layer 126 as indicated by the dotted arrow. On the other hand, electrons are injected from the opposing electrode 138 and transported in a normal direction of the pixel electrodes 122. As a result, the Ohmic current flows in the EL layer over the partition wall 142. This current is called a leak current.

When the leak current cannot be ignored, recombination of the holes and electrons occurs in the first emission layer 130-1 and the second emission layer 130-2 located over the partition wall 142, and these emission layers 130 emit light secondarily. As a result, the desired emission of the first emission layer 130-1 and the secondary emission are mixed. When a part of the pixel electrode 122 is utilized for optical adjustment, the spectrum shapes of the emission obtained from the emission region of the first pixel 104-1 and the secondary emission obtained over the partition wall 142 are not always the same due to the difference in an optical length between over the partition wall 142 and over the pixel electrode 122. Accordingly, emission chromaticity varies, color purity decreases, and color reproducibility and a color gamut of the display device diminishes.

However, the formation of the emission-quenching layer 140 over the partition wall 142 suppresses the secondary emission caused by the leak current or significantly reduces the contribution thereof. The reason is explained below.

Figure 9A:
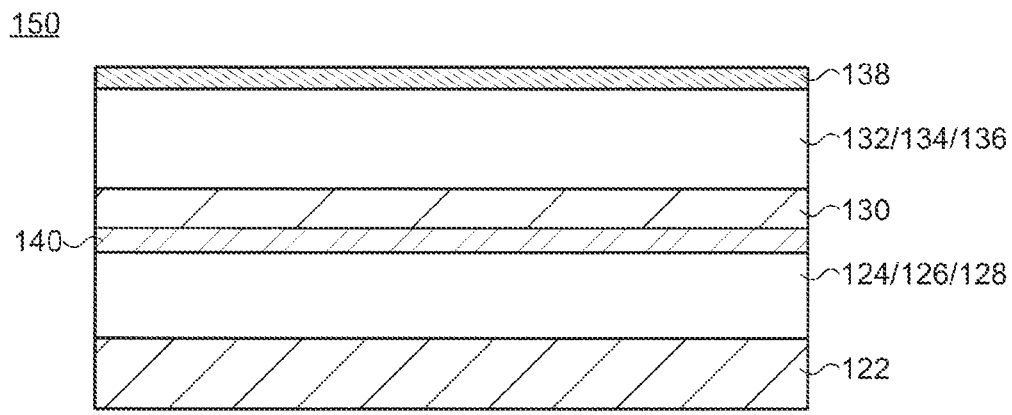
FIG. 9A to FIG. 9C. are schematic cross-sectional views of model light-emitting elements.
Figure 9B:
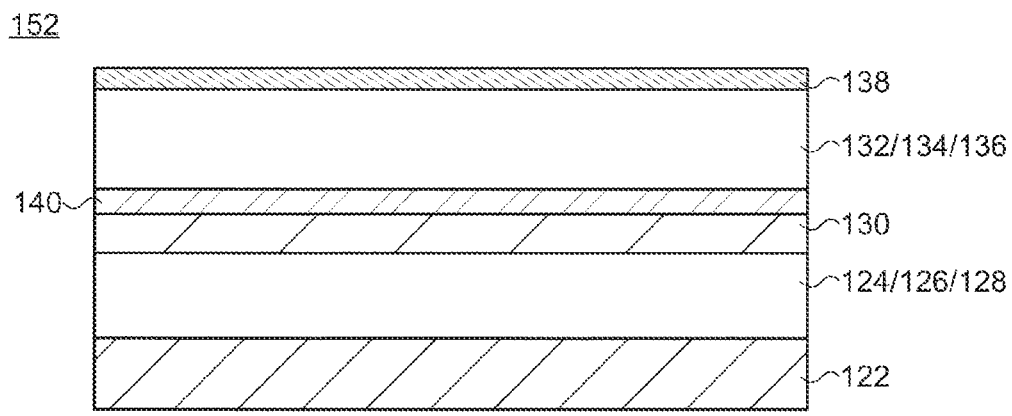
Figure 9C:
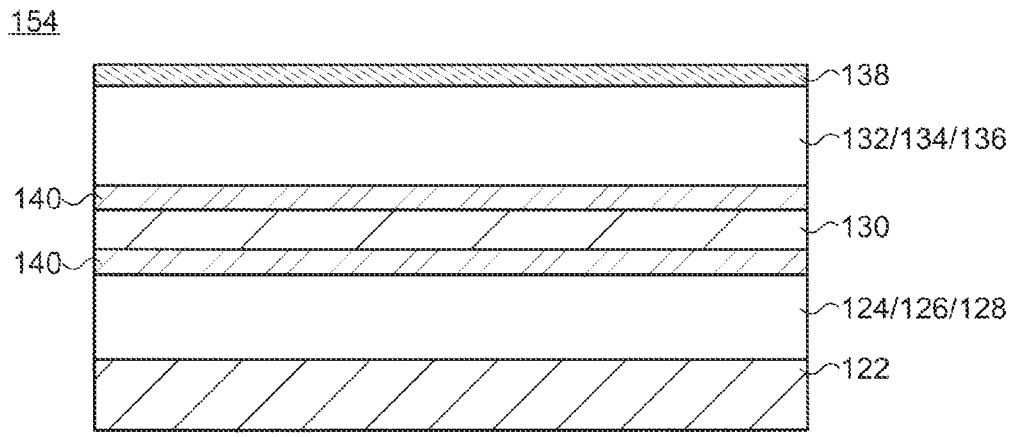

The inventor fabricated blue-emissive model light-emitting elements 150, 152, and 154 shown in FIG. 9A to FIG. 9C, respectively. The model light-emitting element 150 is different from the light-emitting element 120 in having, between the electron-blocking layer 128 and the emission layer 130, the emission-quenching layer 140 consisting of the emission material included in the emission layer 130. The model light-emitting element 152 is different from the light-emitting element 120 in having, between the hole-blocking layer 132 and the emission layer 130, the emission-quenching layer 140 consisting of the emission material included in the emission layer 130. The model light-emitting element 154 is different from the light-emitting element 150 in further having, between the hole-blocking layer 132 and the emission layer 130, the emission-quenching layer 140 consisting of the emission material included in the emission layer 130. The thicknesses of the emission-quenching layers 140 were 5% of the thickness of the emission layer 130.

Evaluation of the properties of the model light-emitting elements 150, 152, and 154 showed a decrease in current efficiency compared with the light-emitting element 120, and the current efficiency of the model light-emitting element 154 particularly decreased by approximately 30% compared with that of the light-emitting element 120. This is probably because the light emission obtained in the emission layer 130 is partly quenched by the emission-quenching layer 140. Thus, it was found that the formation of the emission-quenching layer 140 so as to be in contact with the emission layer 130 reduces the current efficiency of the light-emitting element 120.

Figure 4C:
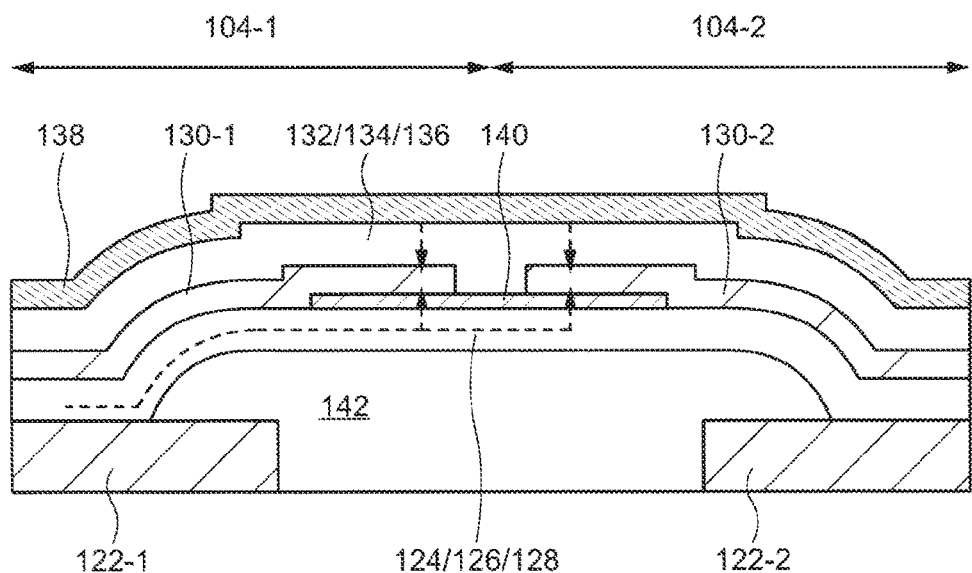

The structure of the EL layer over the partition wall 142 of the aforementioned display device 100 corresponds to the structure of the model light-emitting element 150. Therefore, when an excited state is generated over the partition wall 142, its excitation energy is entirely or partly absorbed by the emission-quenching layer 140. In the display device 100, the leak current may be generated, and the recombination may take place in the EL layer over the partition wall 142 as shown in FIG. 4C. However, the quenching mechanism described above is capable of remarkably decreasing the contribution thereof. Therefore, implementation of the present embodiment prevents or suppresses the secondary emission caused by the leak current, thereby enabling production of a display device with excellent color purity and a wide color gamut.

4. Modified Example

4-1. Material of Emission-Quenching Layer

As described above, at least one of the emission materials included in the emission layers 130 of two light-emitting elements 120 adjacent to the emission-quenching layer 140 may be used for the emission-quenching layer 140. In the example shown in FIG. 4A, for example, any of the emission materials included in the first emission layer 130-1 and the second emission layer 130-2 may be used. In other words, not only a blue-emissive material but also a green- or red-emissive material may be used in the emission-quenching layer 140. In addition, the display device 100 may be configured so that the adjacent emission-quenching layers 140 contain emission materials different from each other.

When the same material is used in all of the emission-quenching layers 140, the emission material of the first emission layer 130-1 exhibiting the shortest emission wavelength may be used, or the emission material of the second emission layer 130-2 or the third emission layer 130-3 may be used. When the emission material included in the second emission layer 130-2 is employed, the excitation energy of the first emission layer 130-1 is readily transferred to and quenched by the emission material of the emission-quenching layer 140 because the emission wavelength of the first emission layer 130-1 is shorter than the emission wavelength of the second emission layer 130-2. Hence, it is possible to effectively suppress the secondary emission caused by the leak current.

4-2. Arrangement of Pixel and Emission-Quenching Layer

Figure 10A:
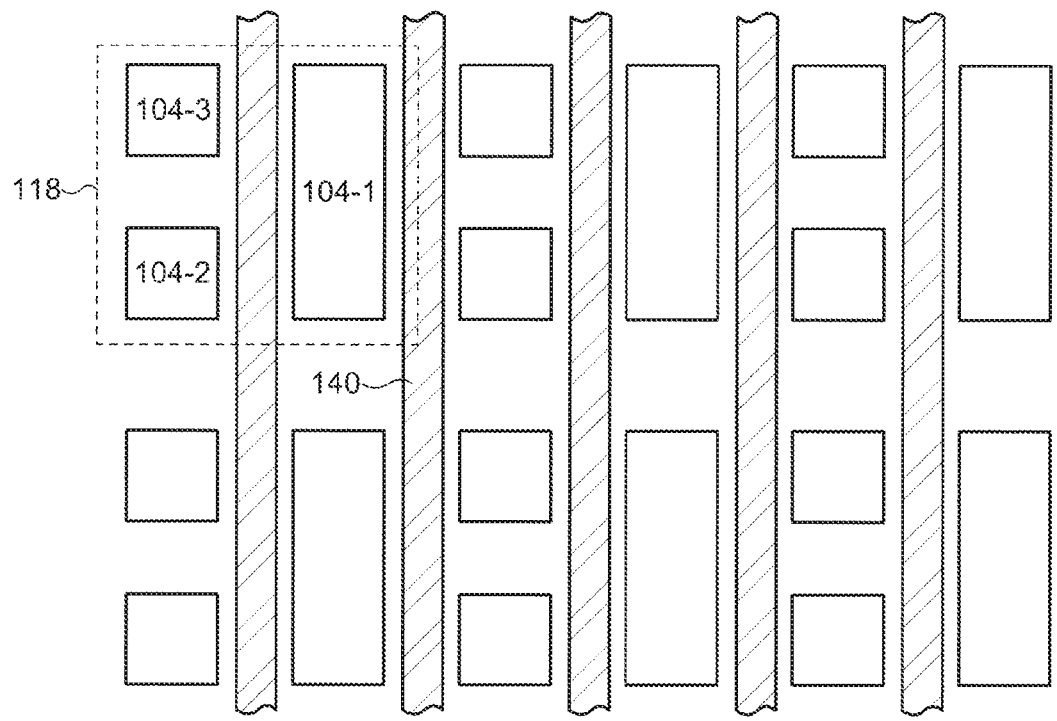
FIG. 10A and FIG. 10B are schematic top views of a display device according to an embodiment of the present invention.

In the examples demonstrated in FIG. 5A to FIG. 7, the so-called stripe arrangement is applied in which the pixels 104 are arranged in the row and column directions to form a matrix shape, and the pixels 104 providing different emission colors are arranged in turn in each row. The pixel arrangement of the display device 100 is not limited thereto. For example, one of the pixels 104 may be different in area from the other pixels 104 arranged in the column direction or the row direction in one pixel group 118 as shown in FIG. 10A. In the example shown in FIG. 10A, the first light-emitting element 120-1 has the largest area, while the other second light-emitting element 120-2 and the third light-emitting element 120-3 have substantially the same area and are arranged in the column direction.

Figure 10B:
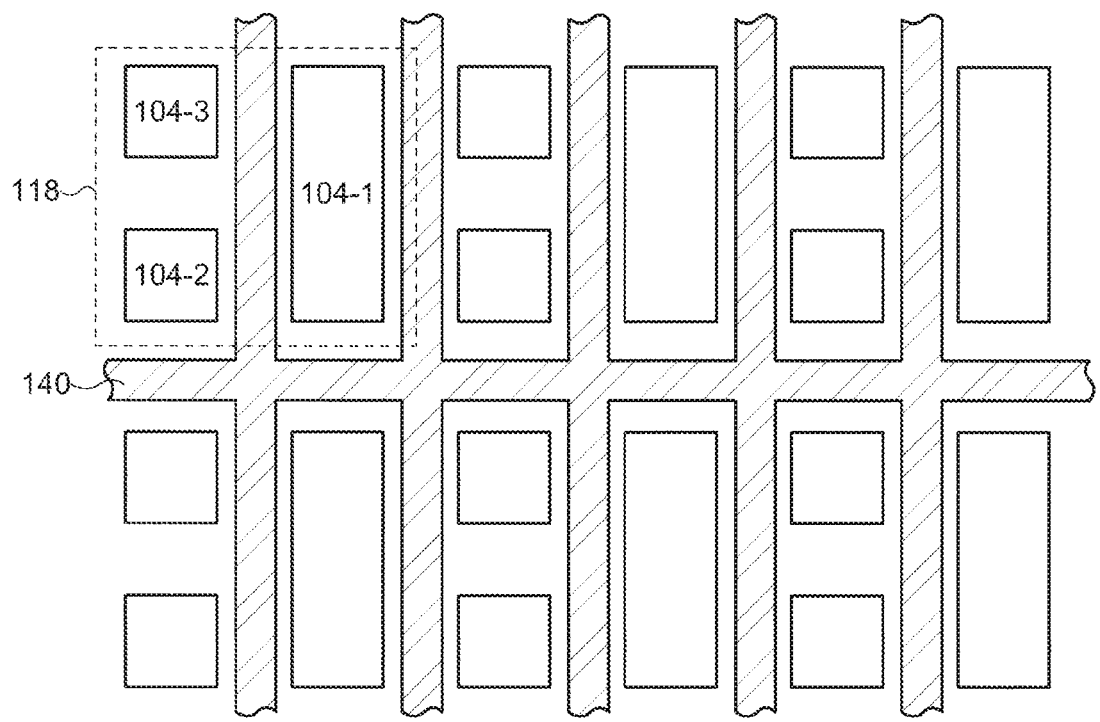
Figure 11:
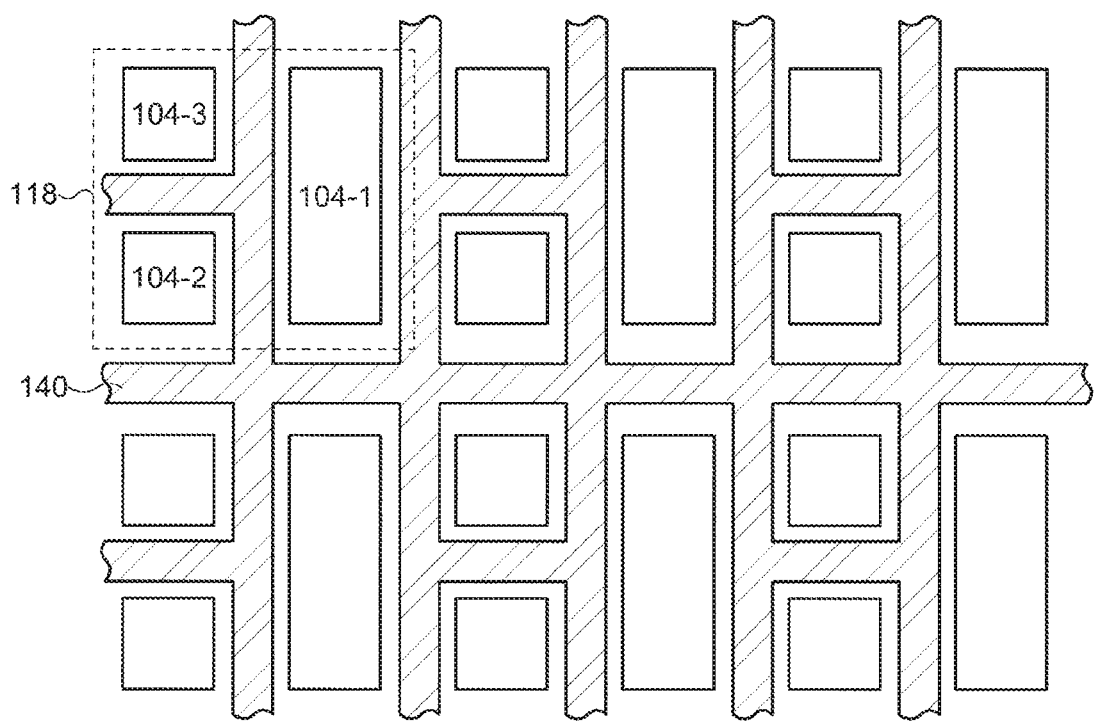
FIG. 11 is a schematic top view of a display device according to an embodiment of the present invention.

In such a pixel arrangement, the emission-quenching layers 140 may be arranged parallel to the wirings 111 as shown in FIG. 10A or may be arranged parallel to the wirings 109 although not shown. Alternatively, the emission-quenching layer 140 may be arranged in a matrix shape so as to have a portion parallel to the wirings 109 and a portion parallel to the wirings 111 as shown in FIG. 10B. Furthermore, the emission-quenching layer 140 may be disposed between the second pixel 104-2 and the third pixel 104-3 as shown in FIG. 11.

Figure 12A:
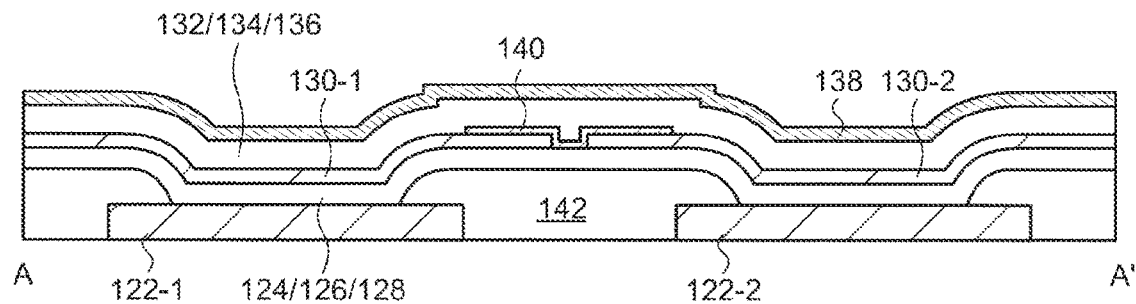
FIG. 12A to FIG. 12C. are schematic cross-sectional views of a light-emitting element of a display device according to an embodiment of the present invention.

4-3. Positional Relationship Between Emission-Quenching Layer and Functional Layers The positional relationship between the emission quenching layer 140 and the functional layers is not limited to that described above, and the emission-quenching layer 140 may be disposed so as to be sandwiched by the emission layer 130 and the opposing electrode 138 as shown in FIG. 12A, for example. More specifically, the emission-quenching layer 140 may be provided so as to be sandwiched by the first emission layer 130-1 and the opposing electrode 138 and also sandwiched by the second emission-layer 130-2 and the opposing electrode 138. In this case, the second emission layer 130-2 may be in contact with the electron-blocking layer 128 or the hole-transporting layer 126. From the results of the model light-emitting element 152, the use of this structure is also effective for preventing or suppressing the secondary emission caused by the leak current.

Figure 12B:
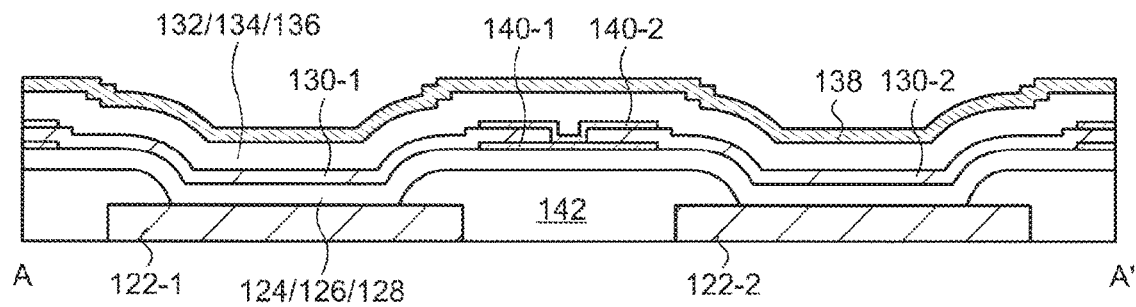

Alternatively, two emission-quenching layers 140 (first emission-quenching layer 140-1 and second emission-quenching layer 140-2) overlapping with each other may be respectively arranged over and under the emission layer 130 as shown in FIG. 12B. In this case, the first emission-quenching layer 140-1 is sandwiched by the first emission layer 130-1 and the partition wall 142 and also sandwiched by the second emission layer 130-2 and the partition wall 142. On the other hand, the second emission-quenching layer 140-2 is sandwiched by the first emission layer 130-1 and the opposing electrode 138 and also sandwiched by the second emission layer 130-2 and the opposing electrode 138. The first emission-quenching layer 140-1 and the second emission-quenching layer 140-2 may be in contact with each other. In addition, the emission materials included in the first emission-quenching layer 140-1 and the second emission-quenching layer 140-2 may be the same as or different from each other. From the results of the model light-emitting element 154, the use of this structure is also effective for preventing or suppressing the secondary emission caused by the leak current.

Figure 12C:
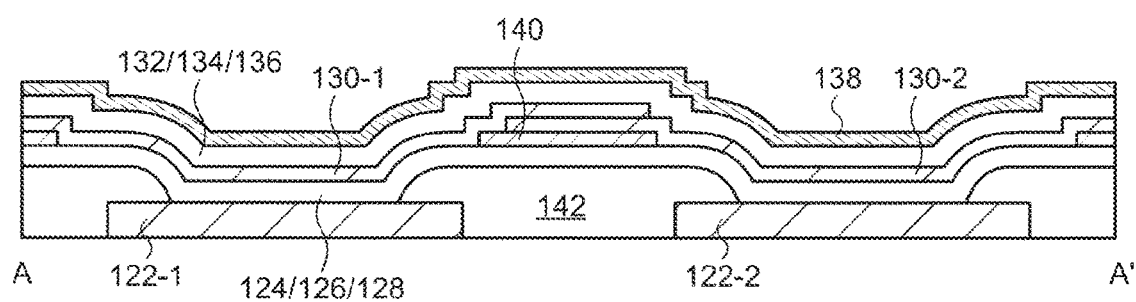

Note that, the emission layers 130 of the adjacent light-emitting elements 120 may overlap with each other as shown in FIG. 12C. In this case, the excitation energy of the emission material located in the first emission layer 130-1 and emitting light at a short wavelength is transferred to the emission material located in the second emission layer 130-2 and emitting light at a longer wavelength and is further quenched by the emission-quenching layer 140, for example. Therefore, it is possible to effectively prevent or suppress the secondary emission caused by the leak current although the two emission layers 130 overlap with each other over the partition wall 142 resulting in an increase in the total thickness.

Second Embodiment

In the present embodiment, a display device 101 having a structure different from that of the display device 100 described in the First Embodiment is explained. An explanation of the structures the same as or similar to those described in the First Embodiment may be omitted.

Figure 13:
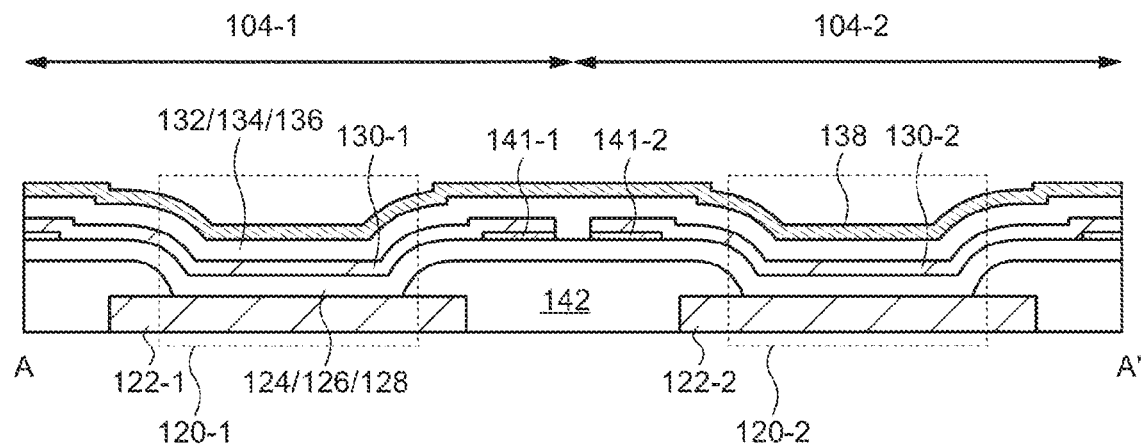
FIG. 13 is a schematic cross-sectional view of a light-emitting element of a display device according to an embodiment of the present invention.

A schematic cross-sectional view of the display device 101 is illustrated in FIG. 13. FIG. 13 corresponds to the schematic cross-sectional view in FIG. 4A. The display device 101 is different from the display device 100 in having two emission-quenching layers (first emission-quenching layer 141-1 and second emission-quenching layer 141-2) over the partition wall 142 located between the adjacent pixels 104. The emission materials included in the first emission-quenching layer 141-1 and the second emission-quenching layer 141-2 may be independently selected from the emission materials included in the first emission layer 130-1, the second emission layer 130-2, and the third emission layer 130-3. Therefore, the emission materials included in the first emission-quenching layer 141-1 and the second emission-quenching layer 141-2 may be the same as or different from each other. For example, the first emission-quenching layer 141-1 may contain the emission material included in the first emission layer 130-1, and the second emission-quenching layer 141-2 may contain the emission material included in the second emission layer 130-2.

The first emission-quenching layer 141-1 and the second emission-quenching layer 141-2 may be respectively in contact with the first emission layer 130-1 and the second emission layer 130-2. In the example shown in FIG. 13, the first emission-quenching layer 141-1 is sandwiched by the first emission layer 130-1 and the partition wall 142, whereas the second emission-quenching layer 141-2 is sandwiched by the second emission layer 130-2 and the partition wall 142. Although not illustrated, the first emission-quenching layer 141-1 and the second emission-quenching layer 141-2 may be formed over the first emission layer 130-1 and the second emission layer 130-2, respectively, similar to the emission-quenching layer 140. Alternatively, the first emission-quenching layer 141-1 may be disposed under the first emission layer 130-1, while the second emission-quenching layer 141-2 may be formed over the second emission layer 130-2. Alternatively, the first emission-quenching layer 141-1 may be disposed over the first emission layer 130-1, while the second emission-quenching layer 141-2 may be formed under the second emission layer 130-2.

Figure 14A:
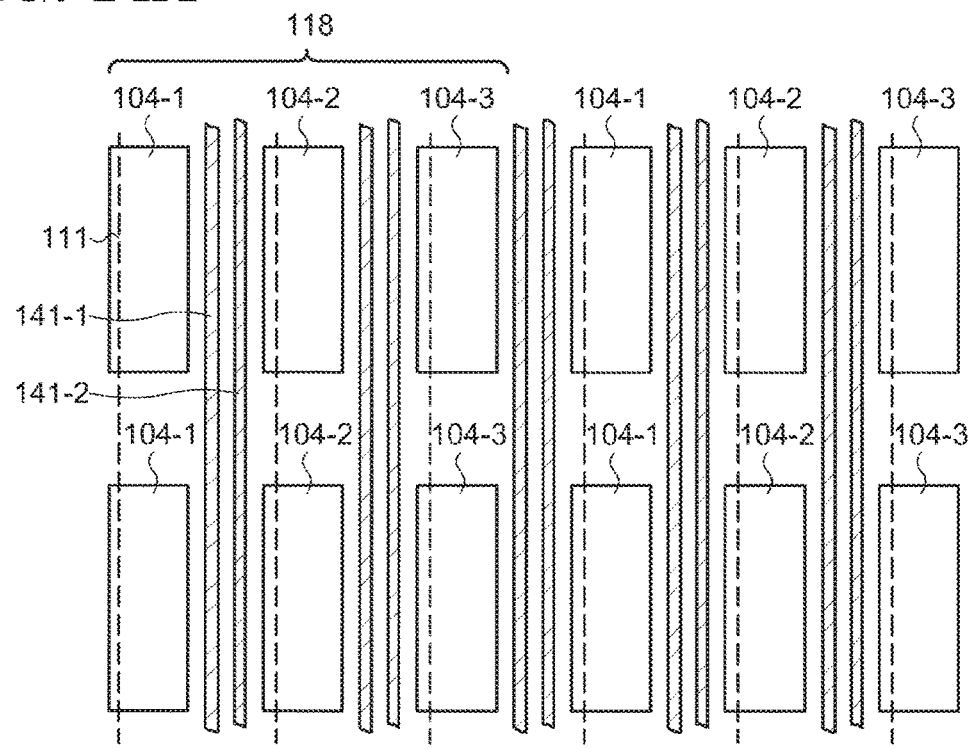
FIG. 14A and FIG. 14B are schematic top views of a display device according to an embodiment of the present invention.
Figure 14B:
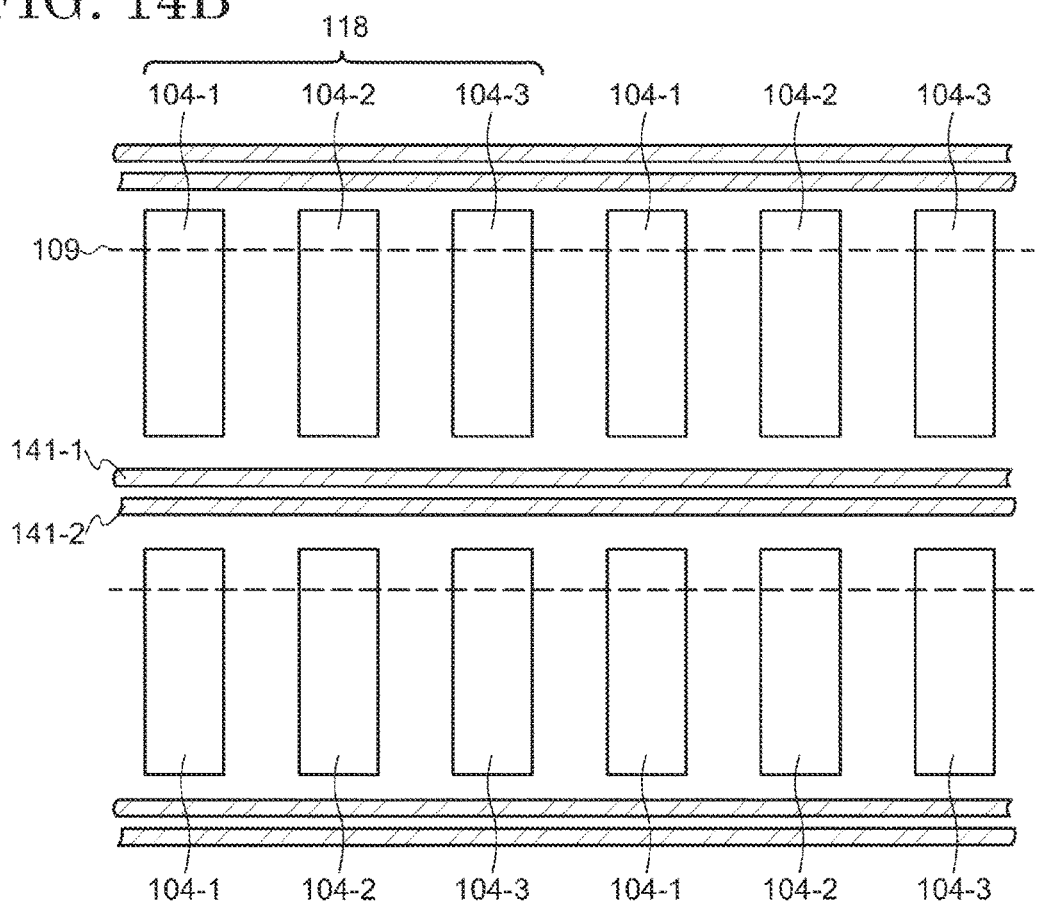

As shown in FIG. 14A, the first emission-quenching layer 141-1 and the second emission-quenching layer 141-2 form a pair in the display device 101. Each pair may be arranged between the adjacent pixels 104. Each pair may also be arranged parallel to the wirings 111 or parallel to the wirings 109 as shown in FIG. 14B. Although not illustrated, a structure may be employed where the pairs of the first emission-quenching layer 141-1 and the second emission-quenching layer 141-2 are respectively disposed between the first pixel 104-1 and the second pixel 104-2 and between the third pixel 104-3 and the first pixel 104-1 but no pair is disposed between the second pixel 104-2 and the third pixel 104-3, similar to the arrangement shown in FIG. 7.

As suggested by the results of the mode light-emitting elements 150, 152, and 154, the use of the emission-quenching layer 141 having such a structure prevents or suppresses the secondary emission caused by cross-talk, thereby providing a display device having excellent color purity and capable of wide color-gamut display.

Third Embodiment

In the present embodiment, a manufacturing method of the display device 100 is described. An explanation of the structures the same as or similar to those described in the First and Second Embodiments may be omitted.

1. Pixel Circuit

Figure 15:
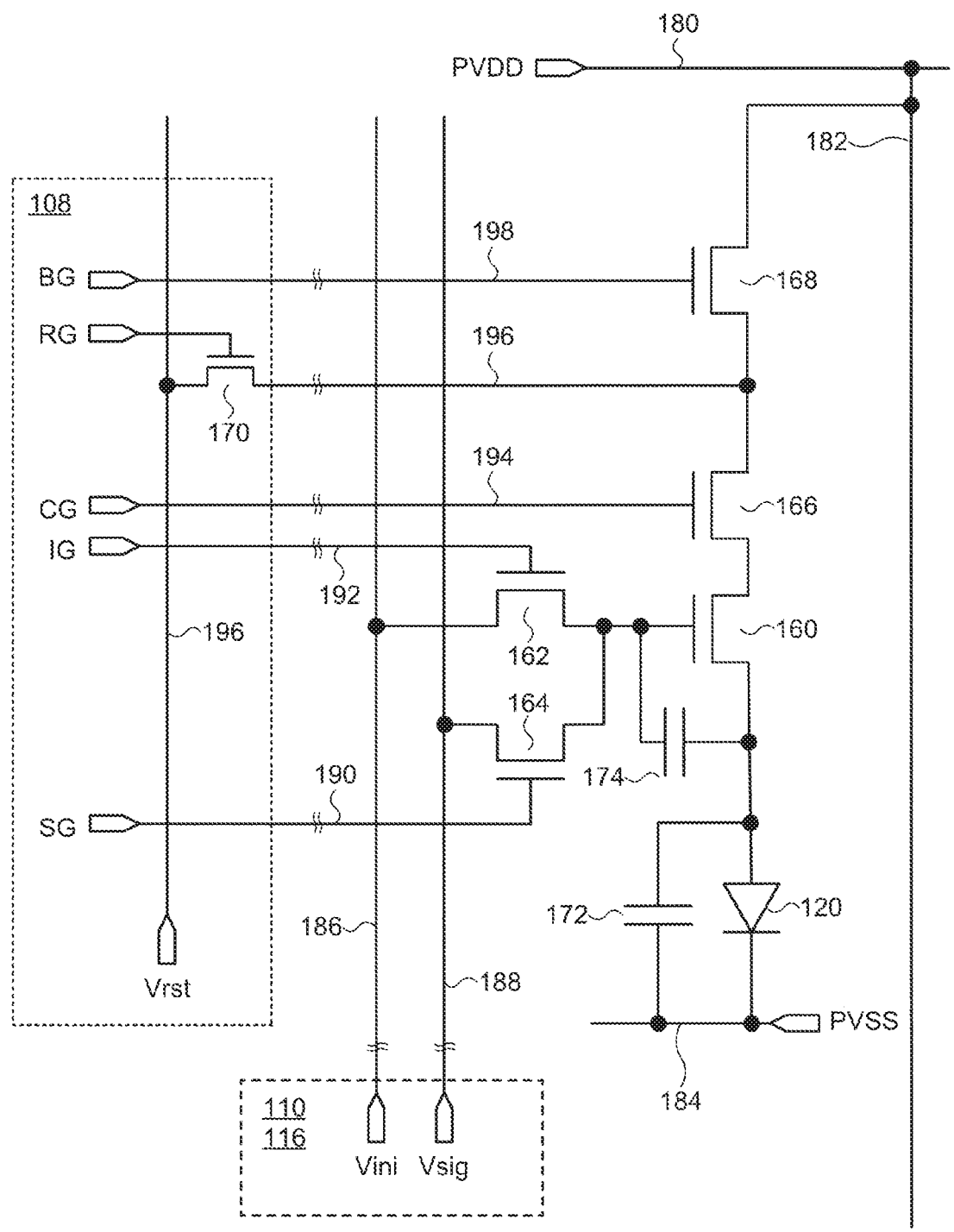
FIG. 15 is an equivalent circuit of a pixel circuit provided in a pixel of a display device according to an embodiment of the present invention.

An example of a pixel circuit formed in the pixel 104 is shown as an equivalent circuit in FIG. 15. As shown in FIG. 15, the pixel circuit includes a driving transistor 160, an emission-controlling transistor 168, a compensating transistor 166, an initializing transistor 162, a writing transistor 164, a storage capacitor 174, and a supplementary capacitor 172 in addition to the light-emitting element 120. A high potential (PVDD) is provided to a high-potential power-source line 180, and this potential is supplied to the pixels 104 connected in each column through a power-source supplying line 182. A low-potential power-source line 184 is provided with a low potential PVSS.

One terminal of the driving transistor 160 is electrically connected to the high-potential power-source line 180 through the emission-controlling transistor 168 and the compensating transistor 166, and the other terminal is electrically connected to the light-emitting element 120. A gate of the driving transistor 160 is electrically connected to a first signal line 186 through the initializing transistor 162 and is also electrically connected to a second signal line 188 through the writing transistor 164. An initialization signal Vini is provided to the first signal line 186, while an image signal Vsig is provided to the second signal line 188. Operation of the writing transistor 164 is controlled by a scanning signal SG supplied to a write-controlling scanning line 190 connected to a gate thereof. A gate of the initializing transistor 162 is connected to an initialization-control scanning line 192 provided with an initialization-control signal IG, and operation thereof is controlled with the initialization-control signal IG. When the writing transistor 164 is on and the initializing transistor 162 is off, a potential of the image signal Vsig is provided to the gate of the driving transistor 160. On the other hand, when the writing transistor 164 is off, and the initializing transistor 162 is on, a potential of the initialization signal Vini is provided to the gate of the driving transistor 160.

A compensation-control scanning line 194 applied with a compensation-control signal CG and an emission-control scanning line 198 applied with an emission-control signal BG are respectively connected to the gates of the compensating transistor 166 and the emission-controlling transistor 168. A reset-controlling line 196 is connected to one terminal of the driving transistor 160 through the compensating transistor 166. The reset-controlling line 196 is connected to a reset transistor 170 disposed in the scanning-line driver circuit 108. The reset transistor 170 is controlled by a reset-control signal RG by which a reset potential Vrst supplied to a reset signal line 196 can be applied to one terminal of the driving transistor 160 through the compensating transistor 166.

The storage capacitor 174 is disposed between the other terminal and the gate of the driving transistor 160. One terminal of the supplementary capacitor 172 is connected to the other terminal of the driving transistor 160, and the other terminal is connected to the low-potential power-source line 184. The supplementary capacitor 172 may be provided so that the other terminal is connected to the high-potential power-source line 180.

The signal-line driver circuit 110 or the driver IC 116 outputs the initialization signal Vini and the image signal Vsig, whereas the scanning-line driver circuits 108 output the scanning signal SG, the initialization-control signal IG, the compensation-control signal CG, the emission-control signal BG, and the reset-control signal RG. The write-controlling scanning line 190, the initialization-control scanning line 192, the compensation-control scanning line 194, the reset-controlling line 196, the emission-control scanning line 198, and the like are included in the wirings 109 shown in FIG. 1. The first signal line 186, the second signal line 188, the power-source supplying line 182, and the like are included in the wirings 111.

Although not illustrated, the structure of the pixel circuit of the display device 100 is not limited to the structure explained using the equivalent circuit in FIG. 15, and any circuit having an arbitral structure may be applied.

2. Cross-Sectional Structure

Figure 16:
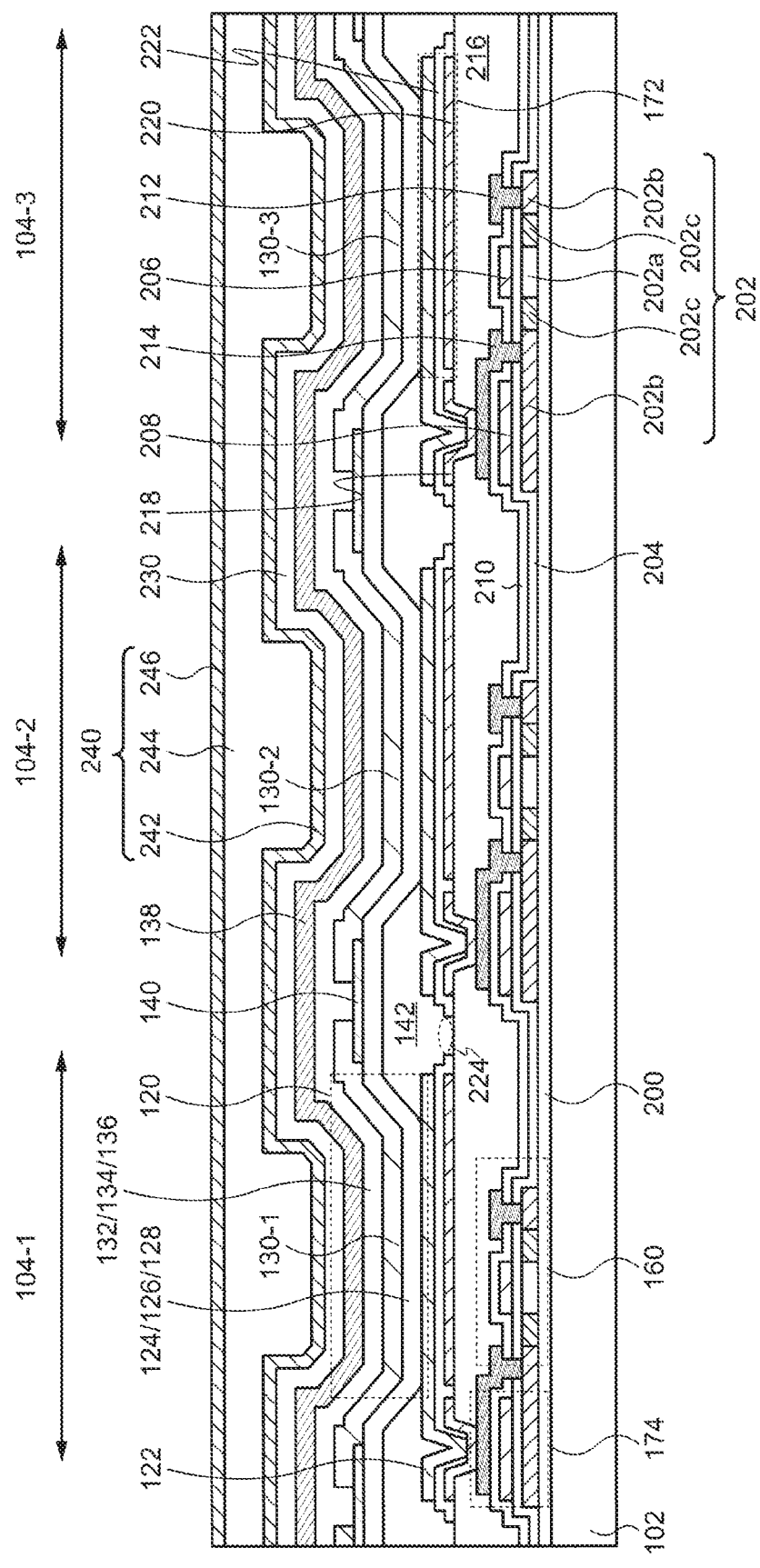
FIG. 16. is a schematic cross-sectional view of a display device according to an embodiment of the present invention.

The structure of the display device 100 is explained using a schematic cross-sectional view illustrated in FIG. 16. FIG. 16 is a schematic cross-sectional view of three pixels (the first pixel 104-1, the second pixel 104-2, and the third pixel 104-3) among the pixels 104. Here, cross-sectional structures of the driving transistor 160, the storage capacitor 174, the supplemental capacitor 172, and the light-emitting element 120 are illustrated among the elements included in each pixel 104.

Each element included in the pixel circuit is disposed over the substrate 102 through an undercoat 200. The substrate 102 may contain glass, quartz, or plastic. As a plastic, a polymer such as a polyimide, a polyamide, a polyester, and a polycarbonate is represented. The use of a plastic provides flexibility to the substrate 102, by which the display device 100 can be bent or folded to give a display device having a variety of three-dimensional structures. The undercoat 200 is structured by one or a plurality of inorganic films such as a film containing silicon oxide and a film containing silicon nitride.

The driving transistor 160 includes a semiconductor film 202, a gate insulating film 204, a gate electrode 206, a drain electrode 212, and a source electrode 214. The gate electrode 206 is arranged so as to intersect with at least a part of the semiconductor film 202 through the gate insulating film 204, and a channel region 202a is formed in the region where the semiconductor film 202 and the gate electrode 206 overlap with each other. The semiconductor film 202 may further possess low-concentration impurity regions 202 sandwiching the channel region 202a as well as high-concentration impurity regions 202b sandwiching the channel region 202a and the low-concentration impurity regions 202c.

A capacitor electrode 208 existing in the same layer as the gate electrode 206 is disposed so as to overlap with the high-concentration impurity region 202b via the gate insulating film 204. An interlayer insulating film 210 is arranged over the gate electrode 206 and the capacitor electrode 208. Openings reaching the high-concentration impurity regions 202b are formed in the interlayer insulating film 210 and the gate insulating film 204, and the drain electrode 212 and the source electrode 214 are arranged so as to cover these openings. A part of the source electrode 214 overlaps with a part of the high-concentration impurity region 202b and the capacitor electrode 208 via the interlayer insulating film 210, and the storage capacitor 174 is configured by a part of the high-concentration impurity region 202b, the gate insulating film 204, the capacitor electrode 208, the interlayer insulating film 210, and a part of the source electrode 214.

A leveling film 216 is further provided over the driving transistor 160 and the storage capacitor 174. The leveling film 216 has an opening reaching the source electrode 214, and a connection electrode 218 covering this opening and a part of a top surface of the leveling film 216 is formed so as to be in contact with the source electrode 214. A supplementary capacitor electrode 220 is further disposed over the leveling film 216. A supplementary capacitor insulating film 222 is arranged so as to cover the connection electrode 218 and the supplementary capacitor electrode 220. The supplementary capacitor insulating film 222 does not cover a part of the connection electrode 218 in the opening of the leveling film 216 and exposes a top surface of the connection electrode 218, by which electrical connection between the pixel electrode 122 formed over the connection electrode 218 and the source electrode 214 is realized through the connection electrode 218. An opening 224 may be formed in the supplementary capacitor insulating film 222 in order to allow contact between the leveling film 216 and the partition wall 142 formed thereover. Impurities in the leveling film 216 can be removed through the opening 224, by which reliability of the light-emitting element 120 can be improved. The formation of the connection electrode 218 and the opening 224 is optional.

The pixel electrode 122 is formed over the supplementary capacitor insulating film 222 so as to cover the connection electrode 218 and the supplementary capacitor electrode 220. The supplementary capacitor insulating film 222 is sandwiched by the supplementary capacitor electrode 220 and the pixel electrode 122, and the supplementary capacitor 172 is formed with this structure. The pixel electrode 122 is shared by the supplementary capacitor 172 and the light-emitting element 120.

The partition wall 142 is disposed over the pixel electrode 122 to cover the edge portion of the pixel electrode 122. The EL layer and the opposing electrode 138 thereover are provided so as to cover the pixel electrode 122 and the partition wall 142. The structures described in the First Embodiment can be applied to the EL layer. The emission-quenching layer 140 is arranged over the partition wall 142.

Here, an example is shown where the emission-quenching layer 140 is formed between the emission layer 130 and the partition wall 142.

The display device may further possess a cap layer 230 as an optional structure. The cap layer 230 has a function to allow the light incident from the emission layer 130 through the opposing electrode 138 to resonate and may be structured with a plurality of layers having a different refractive index.

The display device 100 may further include a passivation film 240 over the opposing electrode 138 or the cap layer 230. The structure of the passivation film 240 is also arbitrarily determined, and a structure including a first inorganic layer 242, an organic layer 244, and a second inorganic layer 246 may be employed as shown in FIG. 16. The first inorganic layer 242 and the second inorganic layer 246 contain an inorganic compound exemplified by a silicon-containing inorganic compound such as silicon oxide, silicon nitride, silicon nitride oxide, and silicon oxynitride. The organic layer 244 may contain a polymer such as an acrylic resin and an epoxy resin. The passivation film 240 having such a structure exhibits a high blocking property, by which impurities such as water and oxygen can be prevented from entering the light-emitting elements 120 from the exterior. Accordingly, high reliability can be provided to the display device 100.

3. Manufacturing Method

A state is shown in FIG. 17A where the elements up to the partition wall 142 have been prepared over the substrate 102. Since the structure shown in FIG. 17A may be fabricated by appropriately applying known materials and methods, an explanation of the manufacturing method thereof is omitted.

After forming the partition wall 142, the EL layer is formed to cover the pixel electrode 122 and the partition wall 142. Specifically, the hole-injection layer 124, the hole-transporting layer 126, the electron-blocking layer 128, and the like are formed by applying an evaporation method or a wet-type film-forming method such as an ink-jet method and a spin-coating method (FIG. 17B). When an evaporation method is employed, the region other than the display region 106 is shielded using a metal mask which is not illustrated, and then the materials of the layers described above are sequentially deposited.

Figure 18A:
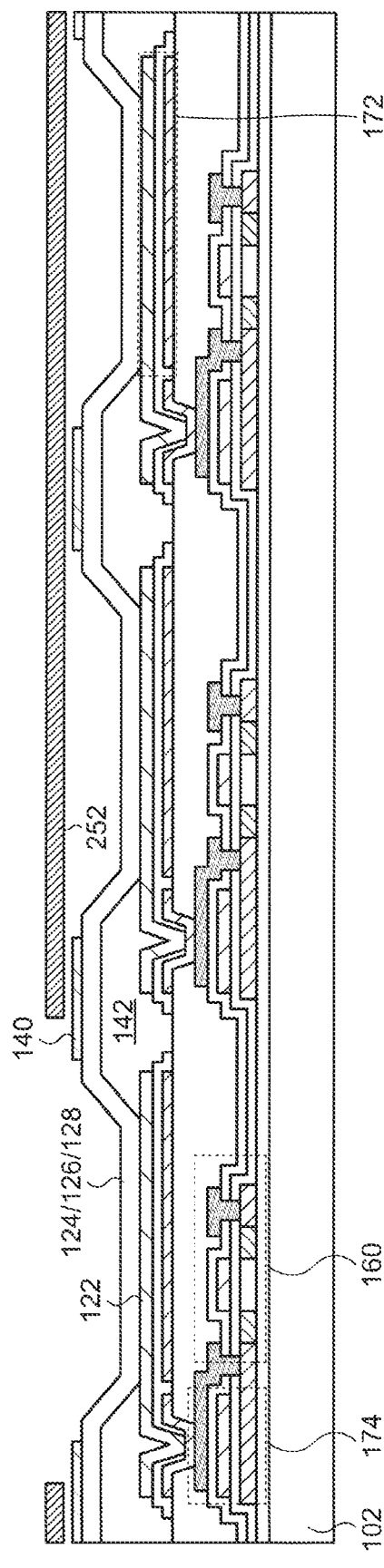
FIG. 18A and FIG. 18B. are schematic cross-sectional views showing a manufacturing method of a display device according to an embodiment of the present invention.

After that, a metal mask 250 is arranged over the substrate 102 (FIG. 17B), and the emission-quenching layer 140 is formed by applying an evaporation method. The metal mask 250 has openings corresponding to the regions in which the emission-quenching layers 140 are to be formed, and the emission material to be included in the emission layer 130 is deposited over the partition wall 142 through the openings (FIG. 18A). The emission-quenching layers 140 may be formed by solely evaporating the emission material to be included in the emission layer 130 or by co-evaporating the emission material and a host material. In the latter case, the host material and the emission material included in the emission layer 130 that is to be formed after forming the emission-quenching layers 140 may be co-evaporated. This method allows this emission layer 130 as well as the emission-quenching layers 140 to be formed in the same chamber. In the case where the emission-quenching layers 140 are formed with co-evaporation, the co-evaporation is carried out so that the concentration of the emission material included in the emission-quenching layers 140 is higher than the concentration of the emission material to be included in the emission layer 130.

In the case where the emission layer 140 is in a matrix shape (see FIG. 6A), the emission-quenching layer 140 is prepared by performing evaporation twice. For example, the portion of the emission-quenching layer 140 parallel to the wirings 109 may be formed by the first evaporation, and then the portion parallel to the wirings 111 may be formed by the second evaporation. Thus, the thickness of the portion in which the portion parallel to the wirings 109 intersects the portion parallel to the wirings 111 is the summation of the thickness of the portion parallel to the wirings 109 and the thickness of the portion parallel to the wirings 111.

Figure 18B:
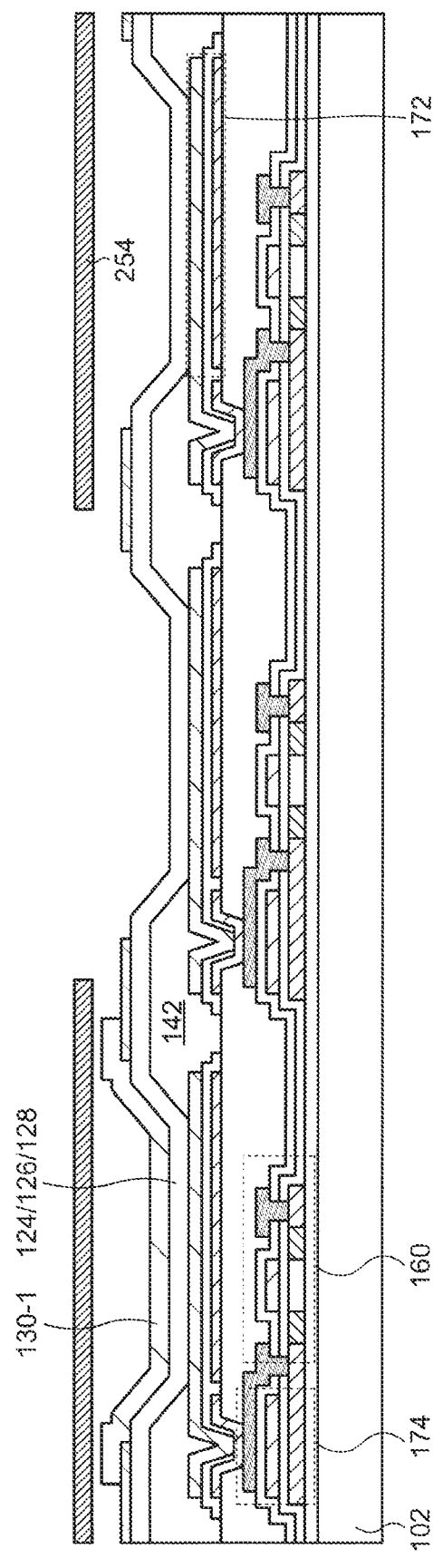

Next, the metal mask 250 is replaced with a metal mask 252 having openings overlapping with the first pixels 104-1 (FIG. 18A), and the first emission layers 130-1 are prepared (FIG. 18B). The first emission layers 130-1 are formed by co-evaporating the host material and the emission material.

Next, the metal mask 252 is replaced with a metal mask 254 having openings overlapping with the second pixels 104-2 (FIG. 18B), and the second emission layers 130-2 are formed (FIG. 19A). Similar to the first emission layers 130-1, the second emission layers 130-2 are also formed by co-evaporating the host material and the emission material because the second emission layers 130-2 contain the host material in addition to the emission material. The third emission layers 130-3 are prepared by the same method (FIG. 19B).

After that, the hole-blocking layer 132, the electron-transporting layer 134, the electron-injection layer 136, and the like are formed by applying an evaporation method or the like, similar to the formation of the hole-injection layer 124, the hole-transporting layer 126, and the electron-blocking layer 128 (FIG. 19B). In this case, a mask having the same shape as the metal mask used to form the hole-injection layer 124, the hole-transporting layer 126, and the electron-blocking layer 128 may be used.

Figure 20:
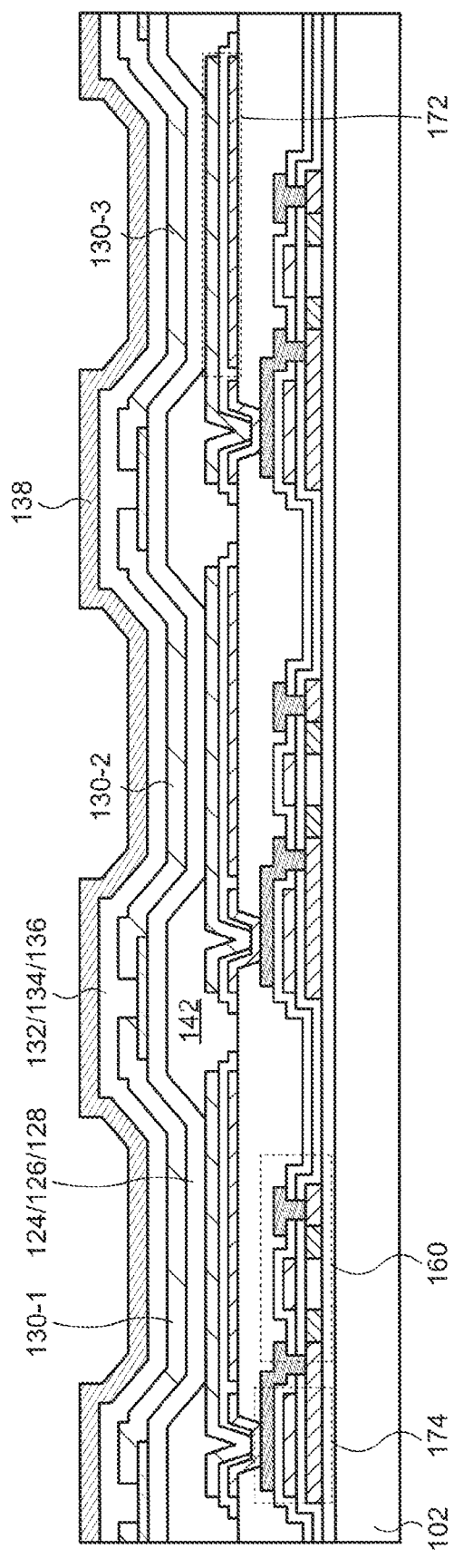
FIG. 20 is a schematic cross-sectional view showing a manufacturing method of a display device according to an embodiment of the present invention.

After that, the opposing electrode 138 is formed (FIG. 20). The opposing electrode 138 may be formed by applying an evaporation method or by using a sputtering method. For example, the opposing electrode 138 can be conveniently formed by applying an evaporation method when a metal such as aluminum, silver, or magnesium is used for the opposing electrode 138. On the other hand, a sputtering method is appropriate when a conductive oxide such as IZO or ITO is utilized.

The formation of the cap layer 230 and the passivation film 240 can be formed by appropriately applying known materials and methods. Thus, its explanation is omitted.

The display device 100 can be manufactured through the processes described above. In these processes, the formation order of the first emission layers 130-1, the second emission layers 130-2, and the third emission layers 130-3 may be changed as appropriate. Furthermore, when the emission-quenching layer 140 is formed over the emission layers 130, evaporation using the metal mask 250 may be carried out after forming the emission layers 130. In the method described above, the functional layers other than the emission layers 130 are formed so as to be shared by all of the pixels 104. However, the EL layer may be formed so that a part of the functional layers is different in structure between the adjacent pixels 104. For example, the EL layer may be formed so that the materials or the thicknesses of the hole-transporting layers 126 are different between the adjacent pixels 104.

As described in the First and Second Embodiments, the display device 100 manufactured by the aforementioned manufacturing method is capable of performing display in which light having excellent color purity is combined and has a wide color gamut because the secondary emission caused by the leak current is prevented or suppressed. Hence, high-quality display can be realized by the display device 100.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
   a first pixel comprising:
      a first pixel electrode;
      a first emission layer over the first pixel electrode, the first emission layer containing a first emission material; and
      an opposing electrode over the first emission layer;
   a second pixel adjacent to the first pixel, the second pixel comprising:
      a second pixel electrode;
      a second emission layer over the second pixel electrode, the second emission layer containing a second emission material; and
      the opposing electrode over the second emission layer;
   a partition wall between the first pixel and the second pixel, the partition wall covering an edge portion of the first pixel electrode and an edge portion of the second pixel electrode; and
   an emission-quenching layer sandwiched by the partition wall and the opposing electrode, the emission-quenching layer containing at least one of the first emission material and the second emission material at a concentration higher than at least one of a concentration of the first emission material in the first emission layer and a concentration of the second emission material in the second emission layer.

2. The display device according to claim 1, wherein the emission-quenching layer is sandwiched by the partition wall and the first emission layer.

3. The display device according to claim 1, wherein the emission-quenching layer is sandwiched by the partition wall and the second emission layer.

4. The display device according to claim 1, wherein the emission-quenching layer is sandwiched by the first emission layer and the opposing electrode.

5. The display device according to claim 1, wherein the emission-quenching layer is sandwiched by the second emission layer and the opposing electrode.

6. The display device according to claim 1,
wherein the emission-quenching layer consists of one of the first emission material and the second emission material.

7. The display device according to claim 1,
wherein an emission wavelength of the first emission material is shorter than an emission wavelength of the second emission material, and
the emission-quenching layer contains the second emission material.

8. The display device according to claim 7,
wherein the first emission layer covers a part of the second emission layer over the partition wall, and
the emission-quenching layer is sandwiched by the partition wall and the second emission layer.

9. The display device according to claim 1,
wherein the emission-quenching layer is in contact with the first emission layer and the second emission layer.

10. The display device according to claim 1,
wherein a thickness of the emission-quenching layer is equal to or more than 2% and equal to or less than 10% of a thickness of one of the first emission layer and the second emission layer.

11. The display device according to claim 1, further comprising a wiring electrically connected to the first pixel and the second pixel,
wherein the emission-quenching layer is arranged parallel to the wiring.

12. The display device according to claim 1,
wherein the emission-quenching layer surrounds the first pixel and the second pixel.

13. The display device according to claim 1, further comprising a wiring electrically connected to the first pixel and the second pixel,
wherein the first emission-quenching layer and the second emission-quenching layer are arranged parallel to the wiring.

14. A display device comprising:
a first pixel comprising:
  a first pixel electrode;
  a first emission layer over the first pixel electrode, the first emission layer containing a first emission material; and
  an opposing electrode over the first emission layer;
a second pixel adjacent to the first pixel, the second pixel comprising:
  a second pixel electrode;
  a second emission layer over the second pixel electrode, the second emission layer containing a second emission material; and
  the opposing electrode over the second emission layer;
a partition wall between the first pixel and the second pixel, the partition wall covering an edge portion of the first pixel electrode and an edge portion of the second pixel electrode;
a first emission-quenching layer sandwiched by the partition wall and the opposing electrode, the first emission-quenching layer containing the first emission material at a concentration higher than a concentration of the first emission material in the first emission layer; and
a second emission-quenching layer sandwiched by the partition wall and the opposing electrode, the second emission-quenching layer containing the second emission material at a concentration higher than a concentration of the second emission material in the second emission layer.

15. The display device according to claim 14,
wherein the first emission-quenching layer is sandwiched by the partition wall and the first emission layer, and
the second emission-quenching layer is sandwiched by the partition wall and the second emission layer.

16. The display device according to claim 14,
wherein the first emission-quenching layer is sandwiched by the first emission layer and the opposing electrode, and
the second emission-quenching layer is sandwiched by the second emission layer and the opposing electrode.

17. The display device according to claim 14,
wherein the first emission-quenching layer and the second emission-quenching layer consist of the first emission material and the second emission material, respectively.

18. The display device according to claim 14,
wherein the first emission-quenching layer and the second emission-quenching layer are in contact with the first emission layer and the second emission layer, respectively.

19. The display device according to claim 14,
wherein a thickness of the first emission-quenching layer is equal to or more than 2% and equal to or less than 10% of a thickness of the first emission layer, and
a thickness of the second emission-quenching layer is equal to or more than 2% and equal to or less than 10% of a thickness of the second emission layer.

* * * * *